(12) United States Patent
Chiang et al.

(10) Patent No.: US 11,856,751 B2
(45) Date of Patent: Dec. 26, 2023

(54) DRAIN SHARING FOR MEMORY CELL THIN FILM ACCESS TRANSISTORS AND METHODS FOR FORMING THE SAME

(71) Applicant: Taiwan Semiconductor Manufacturing Company Limited, Hsinchu (TW)

(72) Inventors: Katherine H. Chiang, New Taipei (TW); Ken-Ichi Goto, Hsin-Chu (TW); Chia Yu Ling, Hsinchu (TW); Neil Murray, Hsinchu (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 96 days.

(21) Appl. No.: 17/199,662

(22) Filed: Mar. 12, 2021

(65) Prior Publication Data

US 2022/0293605 A1 Sep. 15, 2022

(51) Int. Cl.
| | | |
|---|---|---|
| *H10B 12/00* | (2023.01) | |
| *H01L 29/786* | (2006.01) | |
| *G11C 11/4097* | (2006.01) | |
| *H01L 21/02* | (2006.01) | |
| *H01L 29/66* | (2006.01) | |
| *G11C 11/408* | (2006.01) | |
| *G11C 11/4091* | (2006.01) | |

(52) U.S. Cl.
CPC ........ *H10B 12/315* (2023.02); *G11C 11/4085* (2013.01); *G11C 11/4091* (2013.01); *G11C 11/4097* (2013.01); *H01L 21/02565* (2013.01); *H01L 29/66969* (2013.01); *H01L 29/7869* (2013.01); *H10B 12/0335* (2023.02); *H10B 12/05* (2023.02); *H10B 12/50* (2023.02)

(58) Field of Classification Search
CPC .............. H10B 12/315; H10B 12/0335; H01L 29/66969; H01L 29/7869
See application file for complete search history.

(56) References Cited

U.S. PATENT DOCUMENTS

| | | | | |
|---|---|---|---|---|
| 10,276,794 B1* | 4/2019 | Peng | .................... | H01L 45/1616 |
| 10,411,013 B2* | 9/2019 | Godo | ...................... | H01L 27/13 |
| 11,101,300 B2* | 8/2021 | Onuki | ............... | H01L 29/78648 |
| 11,164,871 B2* | 11/2021 | Matsuzaki | ........ | H01L 29/78696 |
| 11,404,586 B1* | 8/2022 | Dai | .................... | H01L 29/78618 |
| 2005/0199959 A1* | 9/2005 | Chiang | ............... | H01L 29/7869 |
| | | | | 257/368 |

(Continued)

*Primary Examiner* — Vincent Wall
(74) *Attorney, Agent, or Firm* — The Marbury Law Group, PLLC

(57) ABSTRACT

A first thin film transistor and a second thin film transistor include a semiconducting metal oxide plate located over a substrate, and a set of electrode structures located on the semiconducting metal oxide plate and comprising, from one side to another, a first source electrode, a first gate electrode, a drain electrode, a second gate electrode, and a second source electrode. A bit line is electrically connected to the drain electrode, and laterally extends along a horizontal direction. A first capacitor structure includes a first conductive node that is electrically connected to the first source electrode. A second capacitor structure includes a second conductive node that is electrically connected to the second source electrode.

15 Claims, 47 Drawing Sheets

(56) References Cited

U.S. PATENT DOCUMENTS

| | | | | |
|---|---|---|---|---|
| 2012/0007085 | A1* | 1/2012 | Suzuki | H01L 27/1225 |
| | | | | 257/E29.273 |
| 2015/0187814 | A1* | 7/2015 | Miyairi | H01L 27/10873 |
| | | | | 257/43 |
| 2017/0033111 | A1* | 2/2017 | Yamazaki | H01L 27/10873 |
| 2017/0221899 | A1* | 8/2017 | Uesugi | H01L 28/00 |
| 2020/0006228 | A1* | 1/2020 | Yang | H01L 21/76832 |
| 2020/0126992 | A1* | 4/2020 | Yamazaki | H01L 27/1255 |
| 2021/0376164 | A1* | 12/2021 | Wu | H01L 29/78696 |
| 2021/0407848 | A1* | 12/2021 | Chia | H01L 21/76237 |
| 2021/0408117 | A1* | 12/2021 | Wu | H01L 27/11507 |
| 2022/0246767 | A1* | 8/2022 | Murray | H01L 29/66969 |
| 2022/0271166 | A1* | 8/2022 | Tsai | H01L 27/2436 |
| 2022/0293605 | A1* | 9/2022 | Chiang | H01L 29/66969 |
| 2022/0328346 | A1* | 10/2022 | Lai | H01L 21/76877 |
| 2022/0328501 | A1* | 10/2022 | Wu | H01L 29/78618 |

* cited by examiner

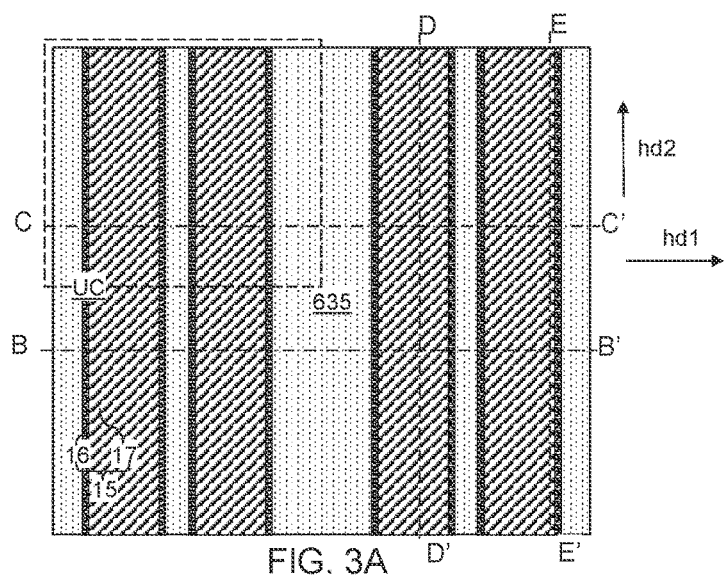
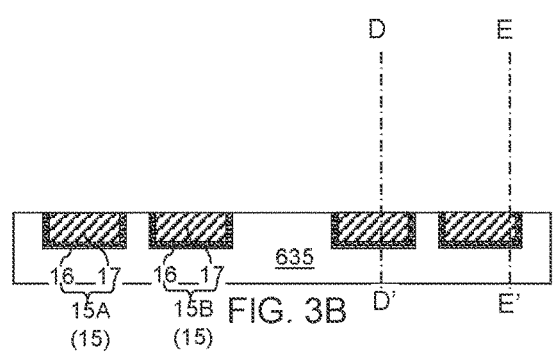 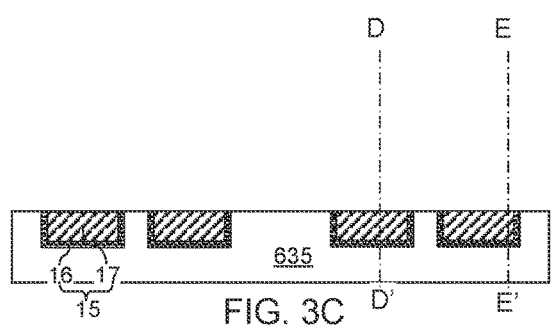

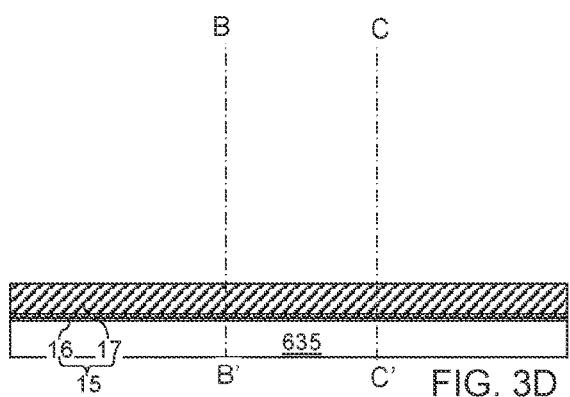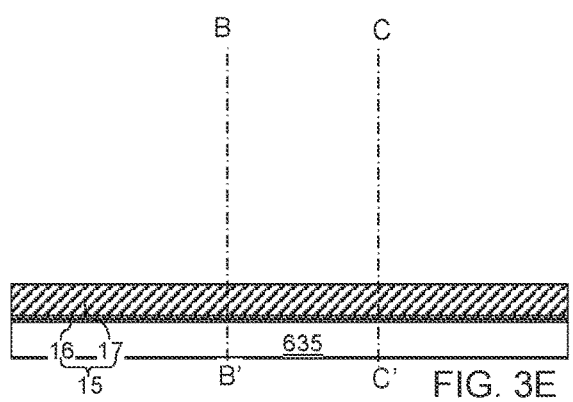

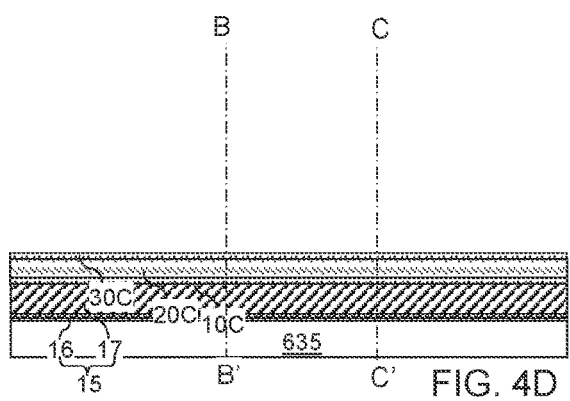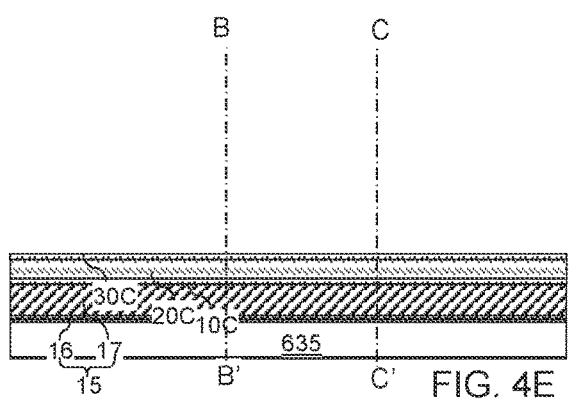

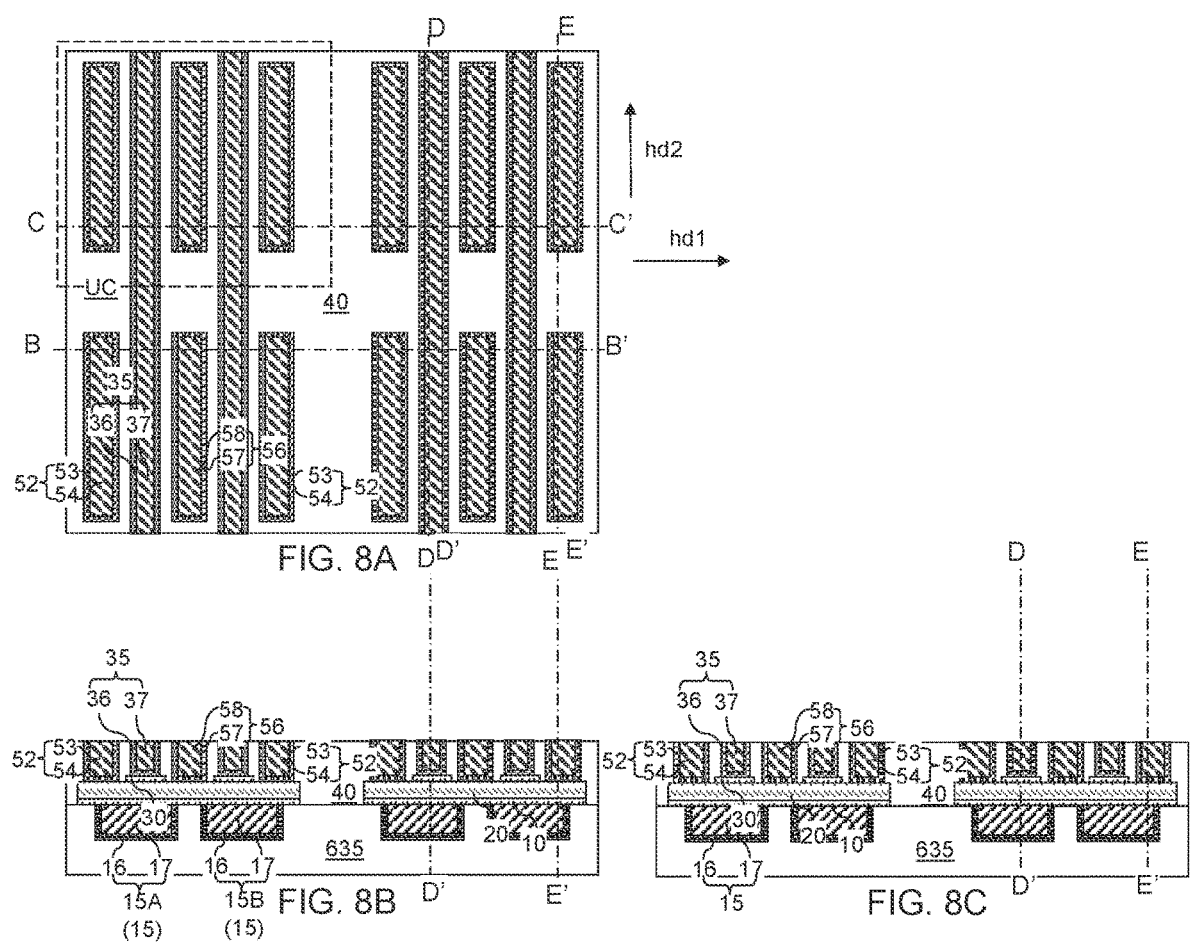

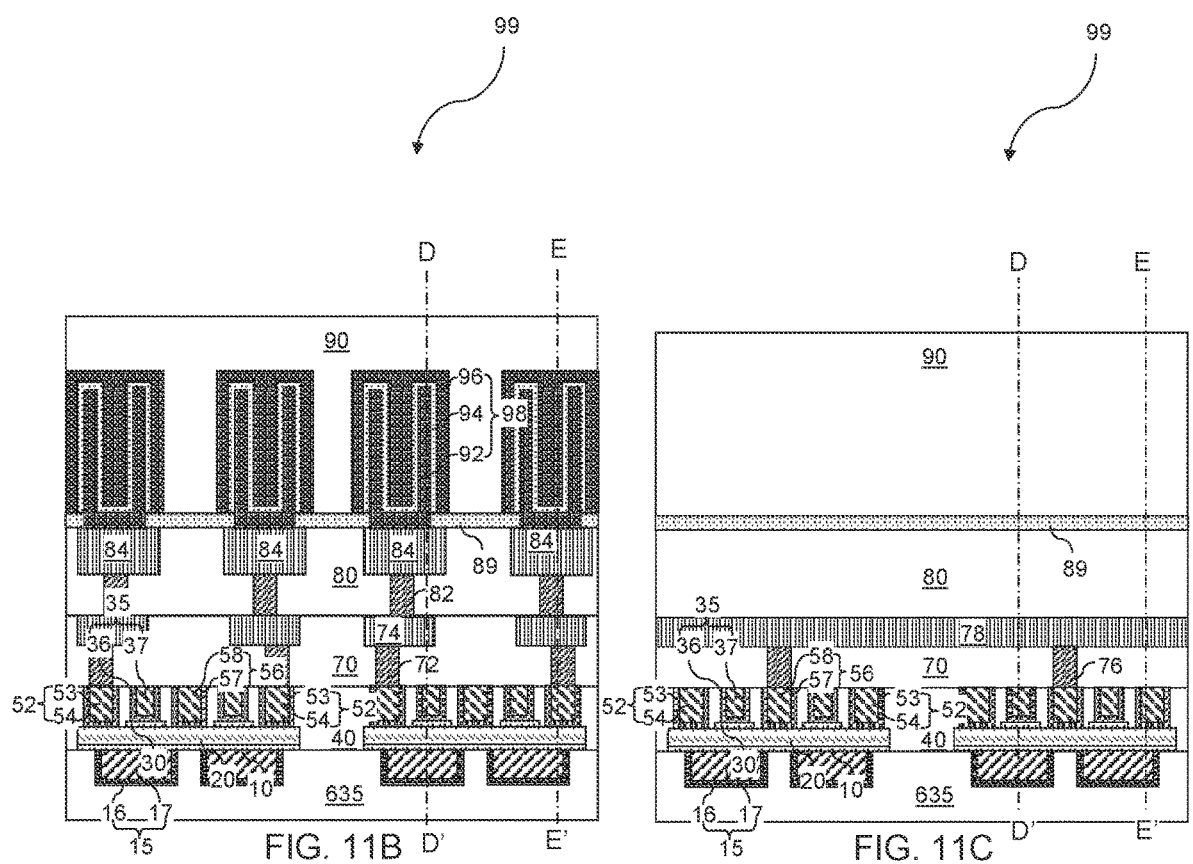

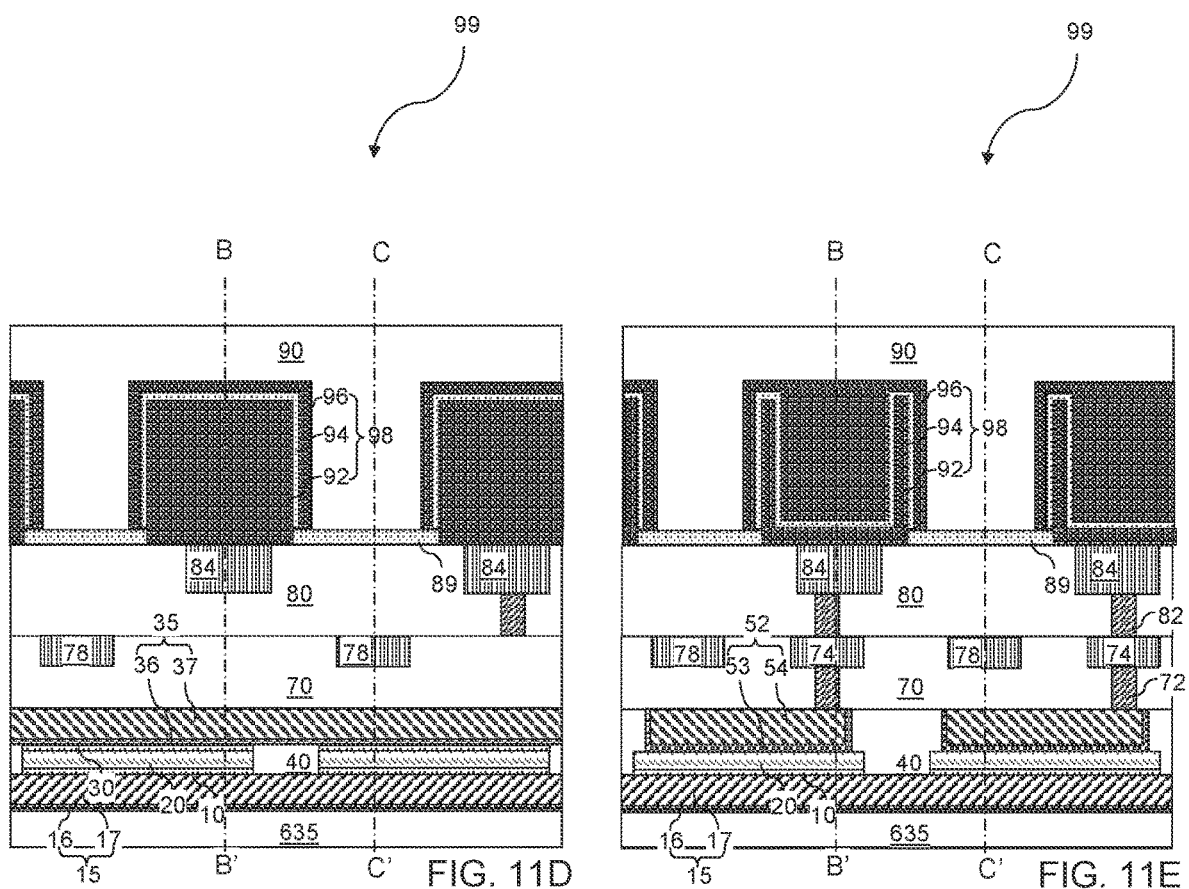

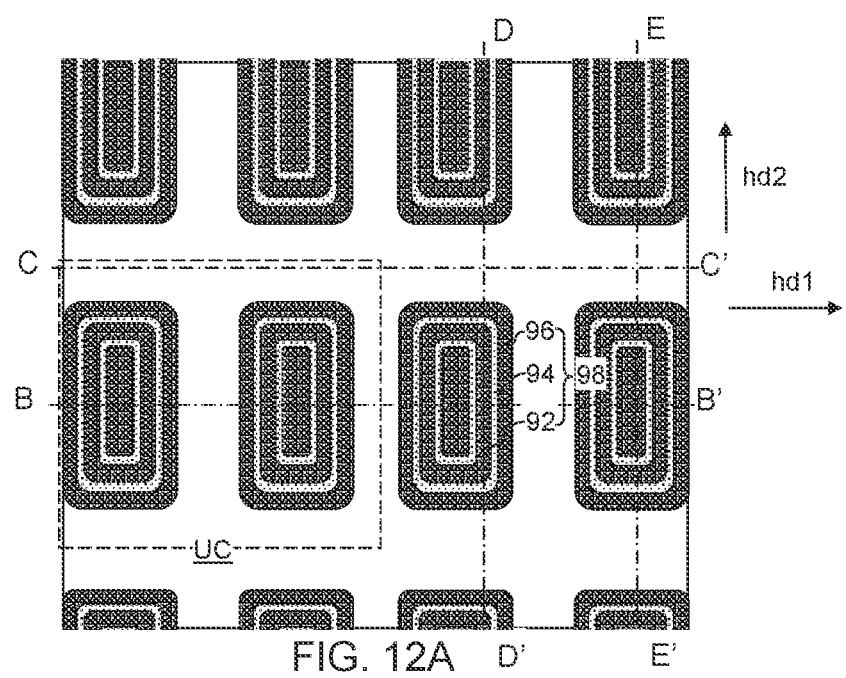

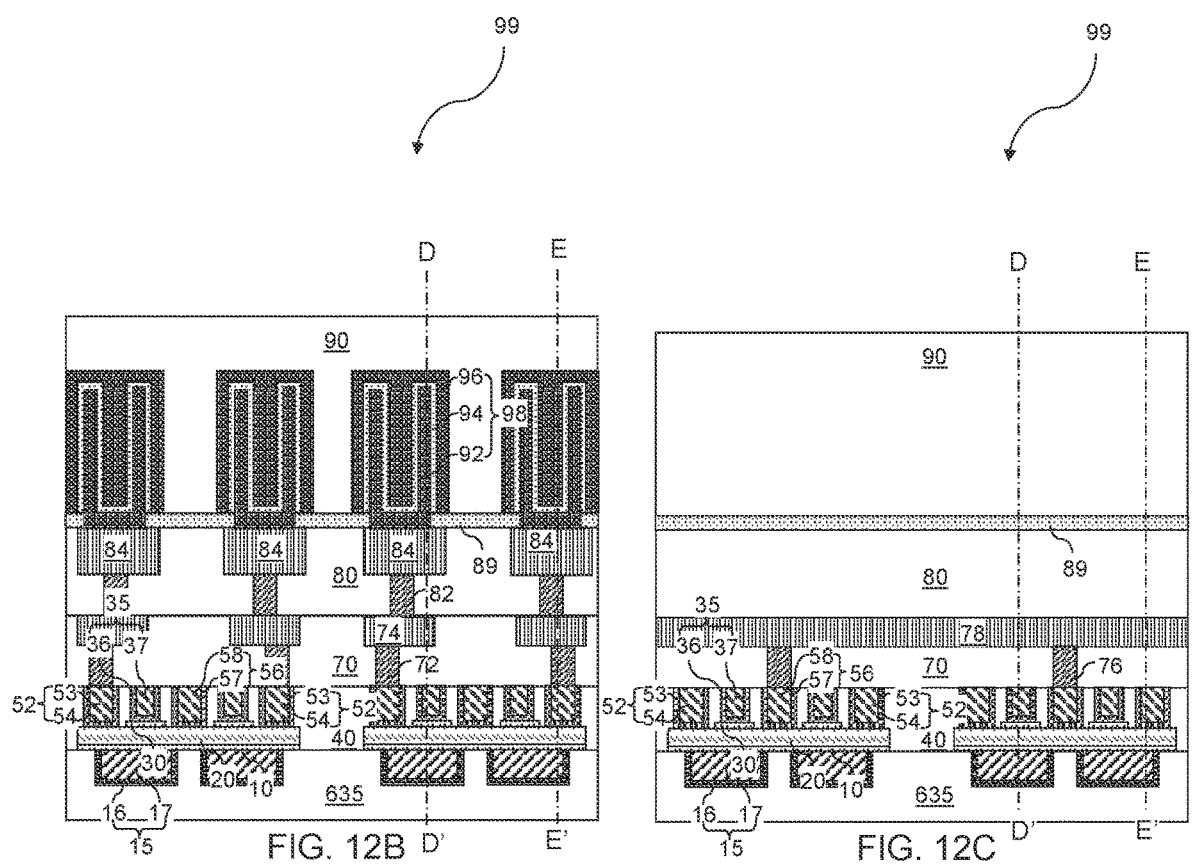

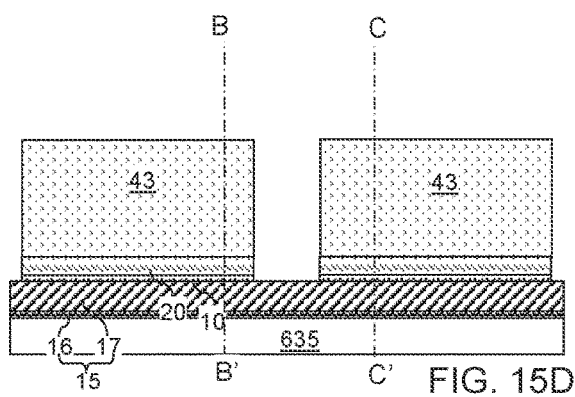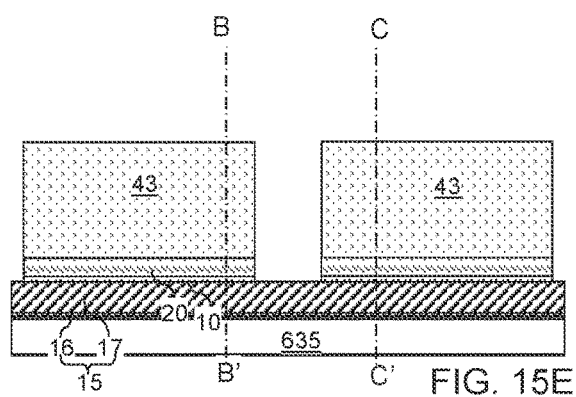

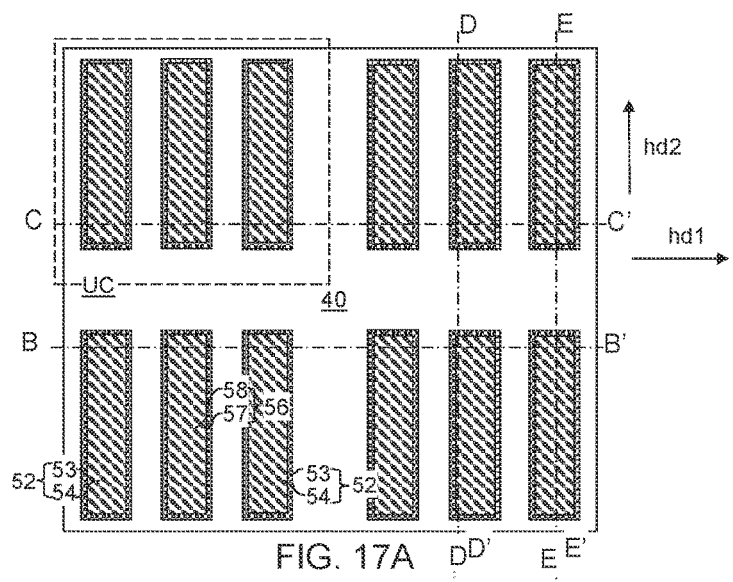
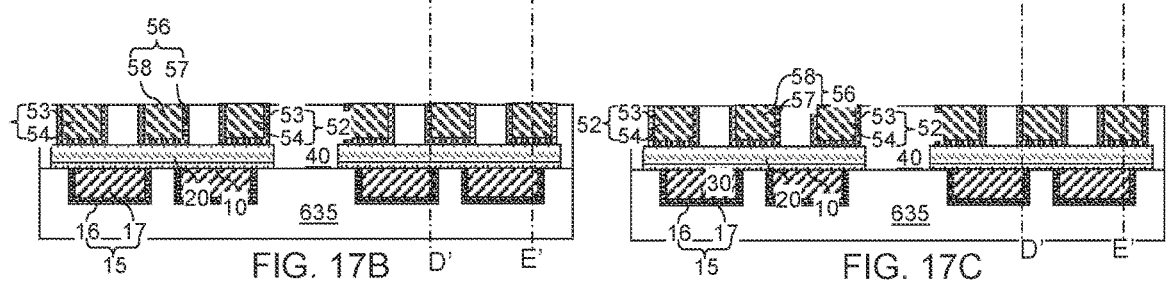
FIG. 17A FIG. 17B FIG. 17C

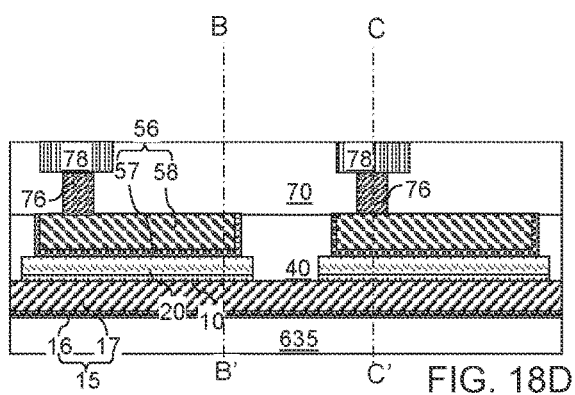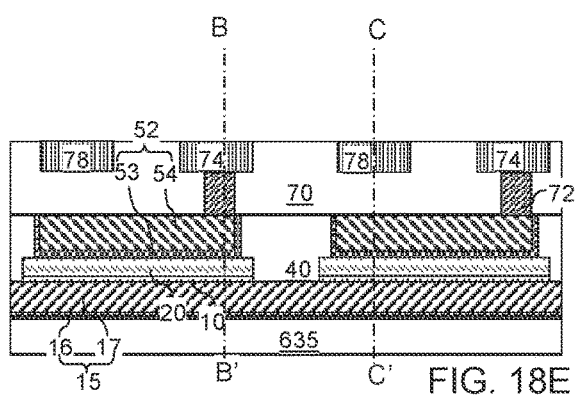

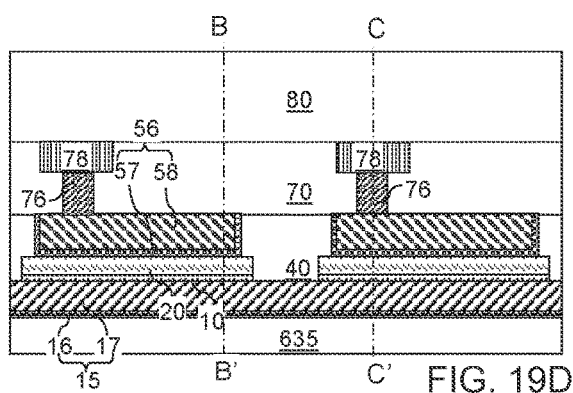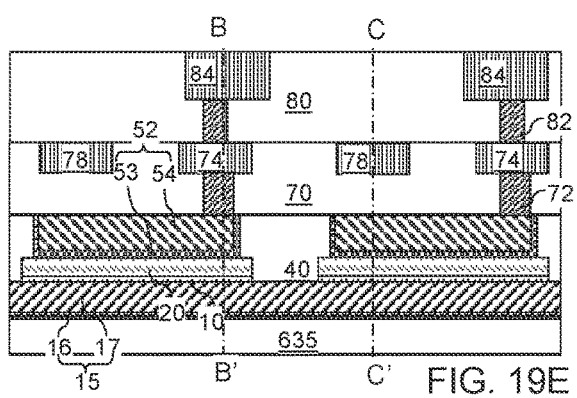

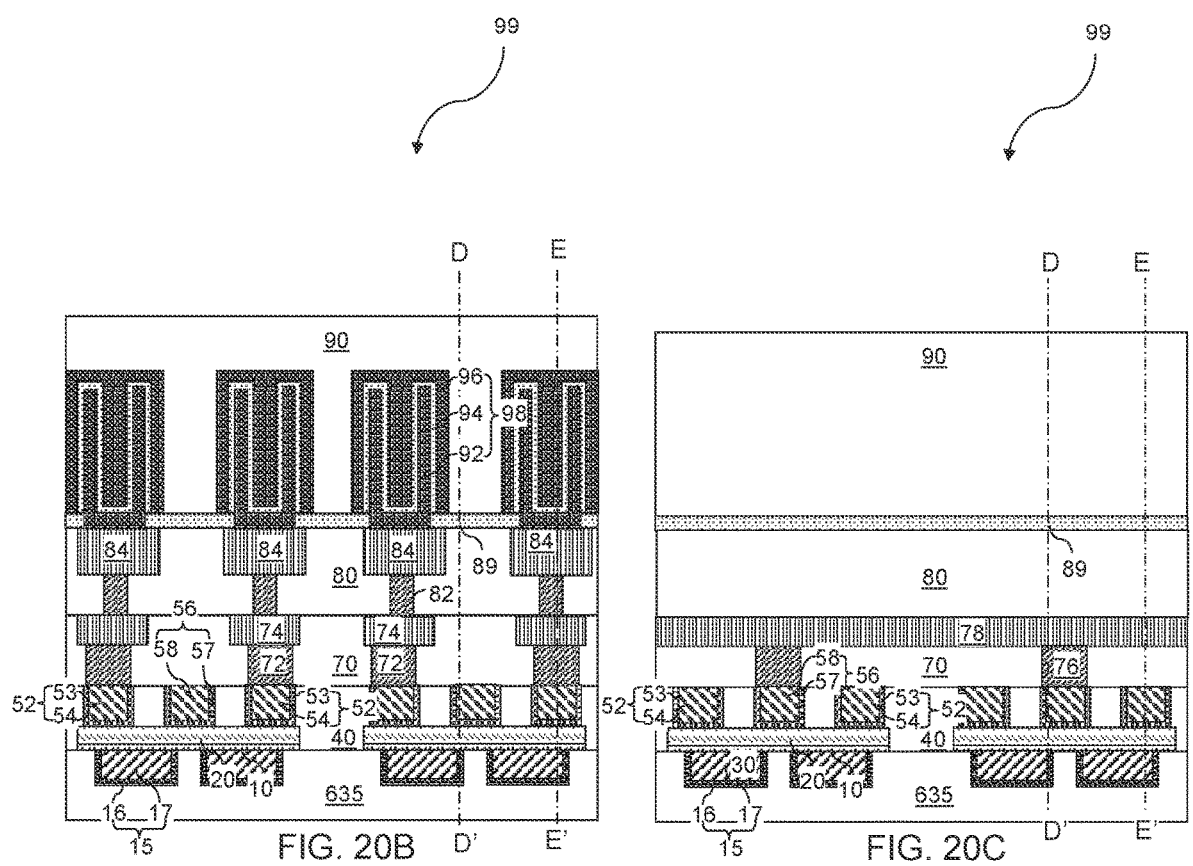

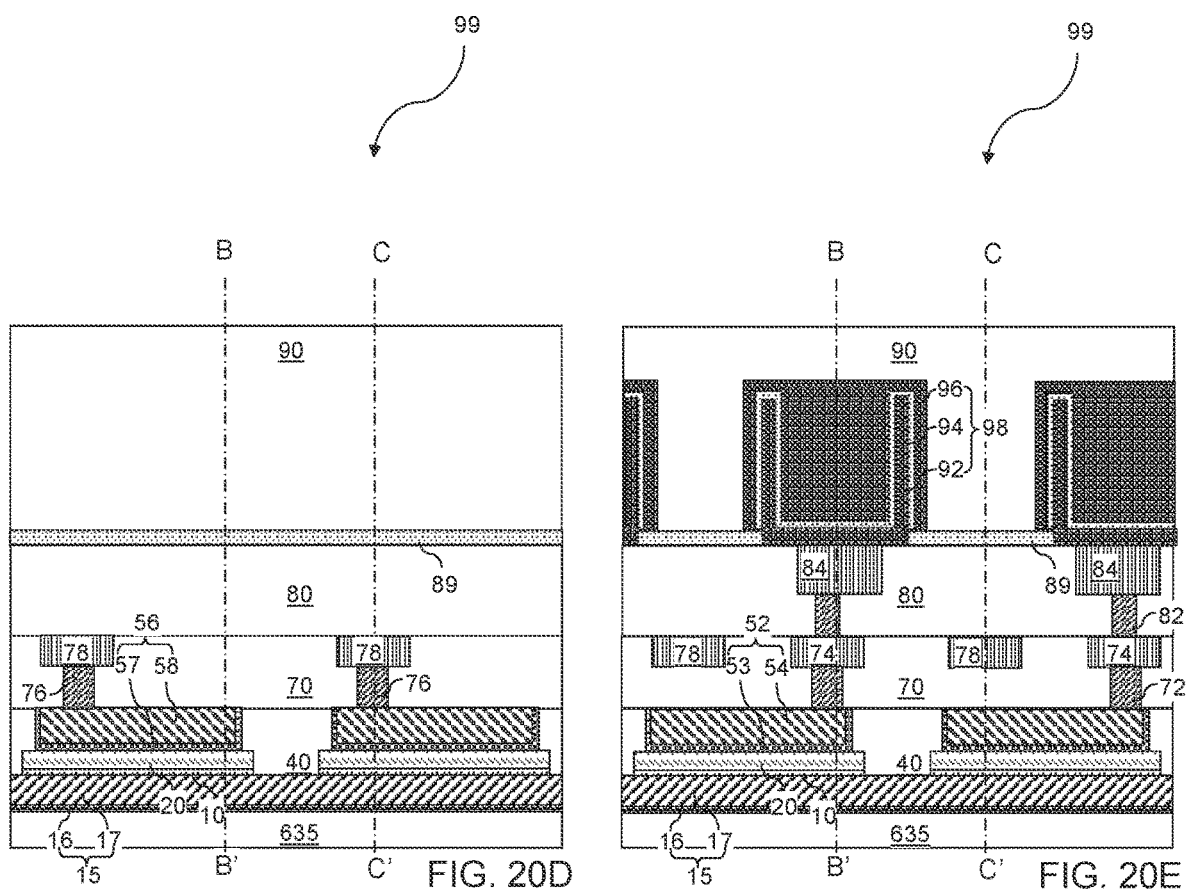

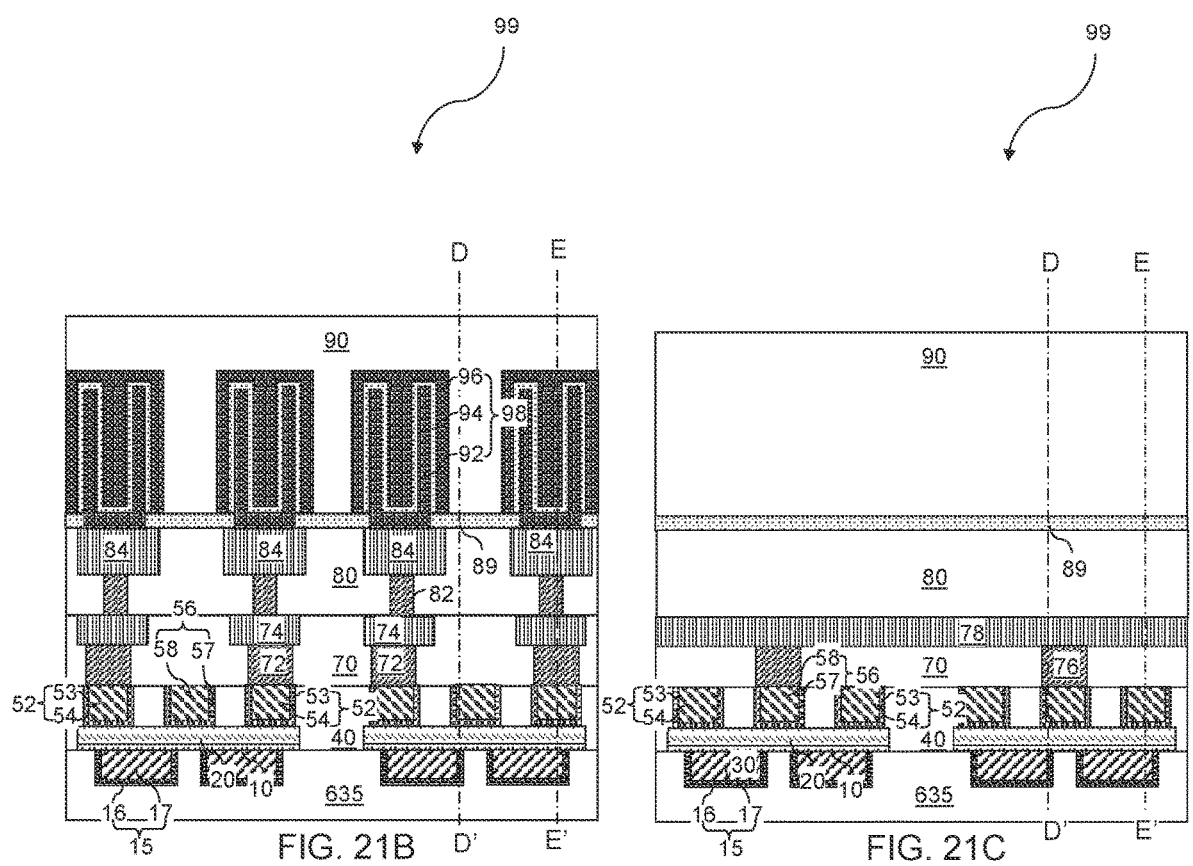

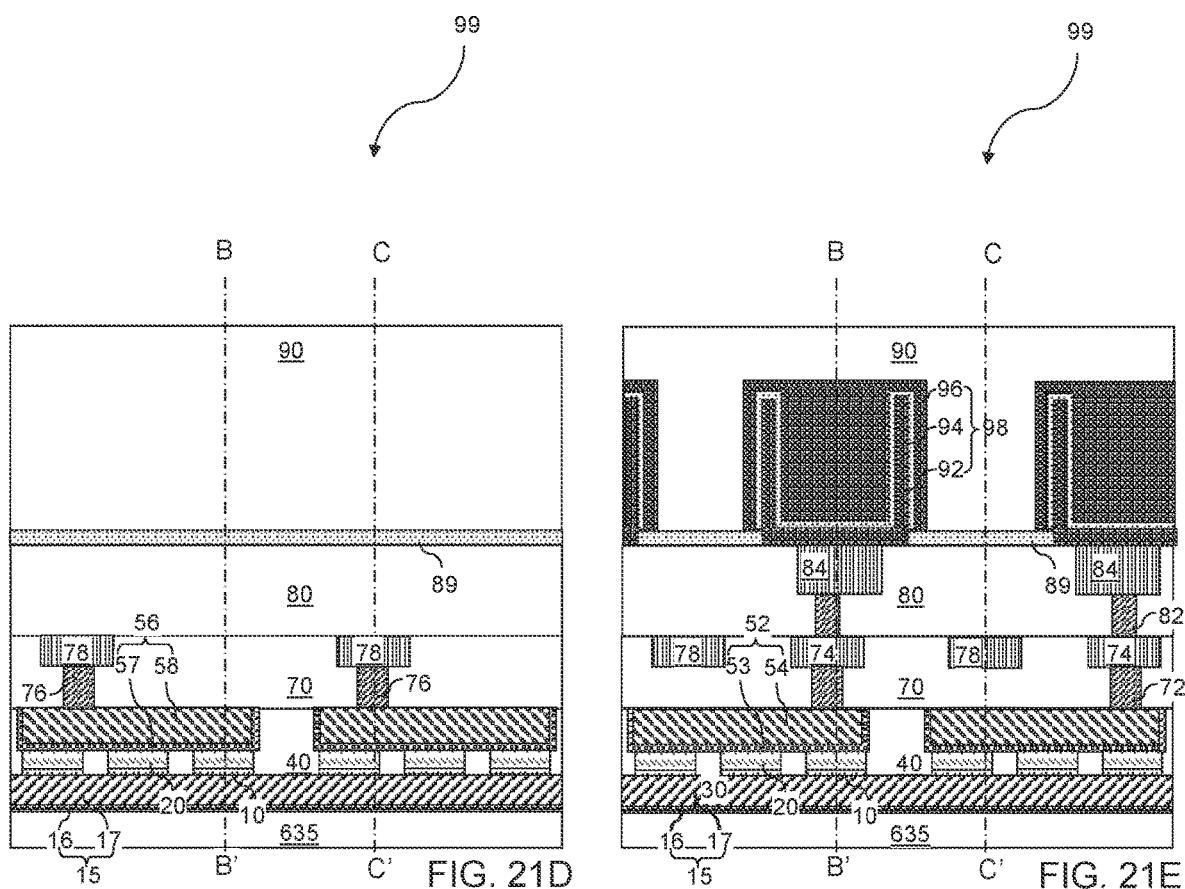

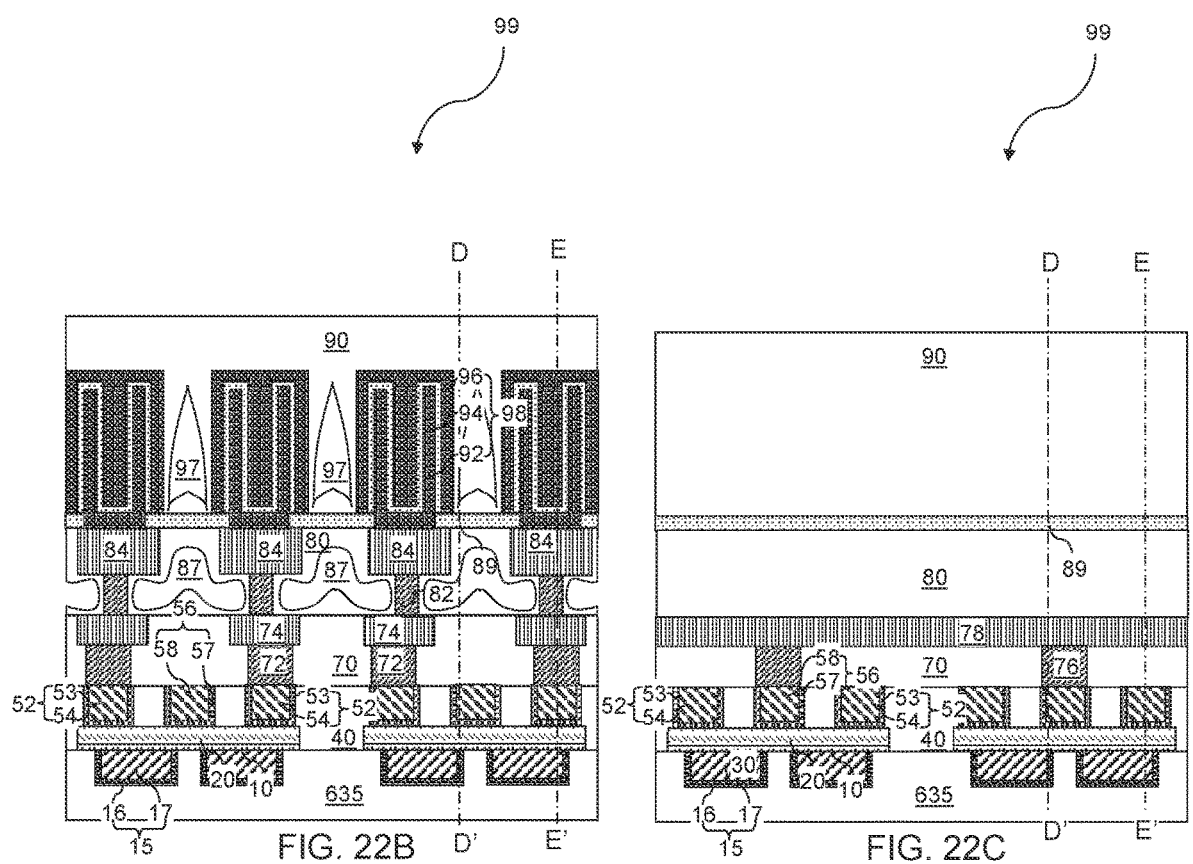

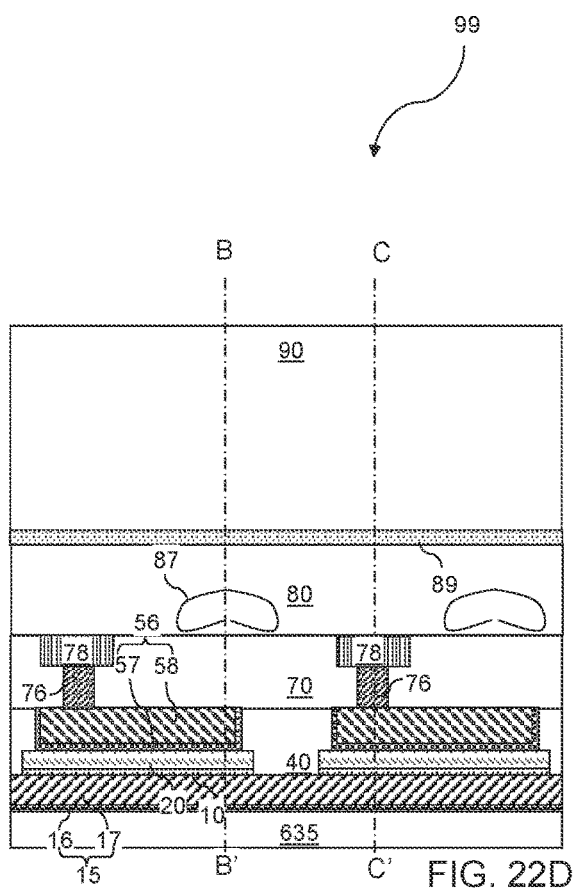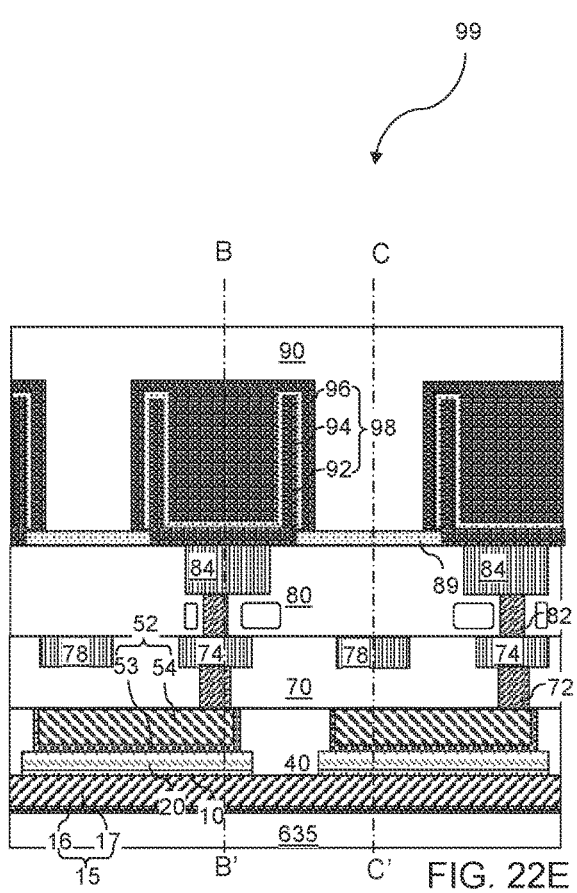

DRAIN SHARING FOR MEMORY CELL THIN FILM ACCESS TRANSISTORS AND METHODS FOR FORMING THE SAME

BACKGROUND

Thin film transistors (TFT) made of oxide semiconductors are an attractive option for BEOL integration since TFTs may be processed at low temperatures and thus, will not damage previously fabricated devices. For example, the fabrication conditions and techniques may not damage previously fabricated FEOL devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a top-down view of a portion of a memory array region of the first exemplary structure after formation of bottom word lines in the bottom gate trenches according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 3D is a vertical cross-sectional view of the first exemplary structure along the vertical plane D-D' of FIG. 3A.

FIG. 3E is a vertical cross-sectional view of the first exemplary structure along the vertical plane E-E' of FIG. 3A.

FIG. 4D is a vertical cross-sectional view of the first exemplary structure along the vertical plane D-D' of FIG. 4A.

FIG. 4E is a vertical cross-sectional view of the first exemplary structure along the vertical plane E-E' of FIG. 4A.

FIG. 8A is a top-down view of a portion of a memory array region of the first exemplary structure after formation of source electrodes, top gate electrodes, and drain electrodes according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 11D is a vertical cross-sectional view of the first exemplary structure along the vertical plane D-D' of FIG. 11A.

FIG. 11E is a vertical cross-sectional view of the first exemplary structure along the vertical plane E-E' of FIG. 11A.

FIG. 12A is a top-down view of a portion of a memory array region of an alternative configuration of the first exemplary structure after formation of capacitor structures according to the first embodiment of the present disclosure. A capacitor-level dielectric material layer is not illustrated for clarity.

FIG. 12B is a vertical cross-sectional view of the alternative configuration of the first exemplary structure along the vertical plane B-B' of FIG. 12A.

FIG. 12C is a vertical cross-sectional view of the alternative configuration of the first exemplary structure along the vertical plane C-C' of FIG. 12A.

FIG. 15D is a vertical cross-sectional view of the second exemplary structure along the vertical plane D-D' of FIG. 15A.

FIG. 15E is a vertical cross-sectional view of the second exemplary structure along the vertical plane E-E' of FIG. 15A.

FIG. 17A is a top-down view of a portion of a memory array region of the second exemplary structure after formation of source electrodes and drain electrodes according to the second embodiment of the present disclosure.

FIG. 17B is a vertical cross-sectional view of the second exemplary structure along the vertical plane B-B' of FIG. 17A.

FIG. 17C is a vertical cross-sectional view of the second exemplary structure along the vertical plane C-C' of FIG. 17A.

FIG. 18D is a vertical cross-sectional view of the second exemplary structure along the vertical plane D-D' of FIG. 18A.

FIG. 18E is a vertical cross-sectional view of the second exemplary structure along the vertical plane E-E' of FIG. 18A.

FIG. 19D is a vertical cross-sectional view of the second exemplary structure along the vertical plane D-D' of FIG. 19A.

FIG. 19E is a vertical cross-sectional view of the second exemplary structure along the vertical plane E-E' of FIG. 19A.

FIG. 20B is a vertical cross-sectional view of the second exemplary structure along the vertical plane B-B' of FIG. 20A.

FIG. 20C is a vertical cross-sectional view of the second exemplary structure along the vertical plane C-C' of FIG. 20A.

FIG. 20D is a vertical cross-sectional view of the second exemplary structure along the vertical plane D-D' of FIG. 20A.

FIG. 20E is a vertical cross-sectional view of the second exemplary structure along the vertical plane E-E' of FIG. 20A.

FIG. 21B is a vertical cross-sectional view of the second exemplary structure along the vertical plane B-B' of FIG. 21A.

FIG. 21C is a vertical cross-sectional view of the second exemplary structure along the vertical plane C-C' of FIG. 21A.

FIG. 21D is a vertical cross-sectional view of the second exemplary structure along the vertical plane D-D' of FIG. 21A.

FIG. 21E is a vertical cross-sectional view of the second exemplary structure along the vertical plane E-E' of FIG. 21A.

FIG. 22B is a vertical cross-sectional view of the exemplary structure along the vertical plane B-B' of FIG. 22A.

FIG. 22C is a vertical cross-sectional view of the exemplary structure along the vertical plane C-C' of FIG. 22A.

FIG. 22D is a vertical cross-sectional view of the exemplary structure along the vertical plane D-D' of FIG. 22A.

FIG. 22E is a vertical cross-sectional view of the exemplary structure along the vertical plane E-E' of FIG. 22A.

DETAILED DESCRIPTION

Figure 1:
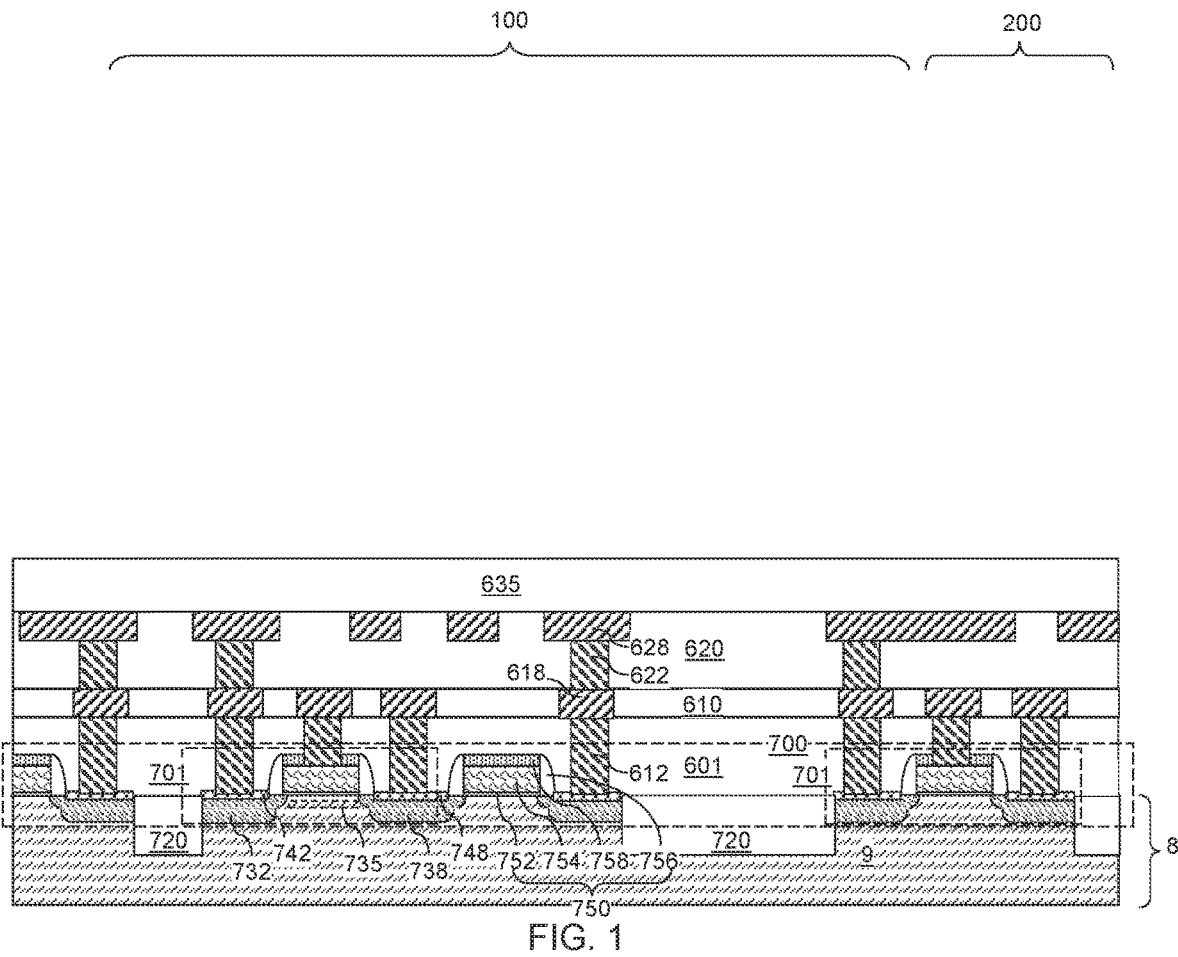
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least two dynamic random access memory cells such as a two-dimensional array of dynamic random access memory cells. Specifically, a semiconducting metal oxide plate may be used to provide a pair of semiconducting channels for a pair of access transistors. A pair of source electrodes and a common drain electrode may be formed on a top surface of the semiconducting metal oxide plate to efficiently use the area of the semiconducting metal oxide plate. Thus, the source electrodes may be formed at end portions of the semiconducting metal oxide plate, and the common drain electrode may be formed at a center portion of the semiconducting metal oxide plate. A pair of capacitor structures may be subsequently formed, and may be subsequently electrically connected to a respective one of the source electrodes. Peripheral circuits for driving word lines and bit lines may be formed directly on a single crystalline silicon layer in an underlying silicon substrate. Metal interconnect structures formed within in dielectric material layers may be provided between the silicon substrate and the dynamic random access memory cells to provide electrical connection between the peripheral circuits and the dynamic random access memory cells.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of ferroelectric memory cells may be subsequently formed. The first exemplary structure may further include a peripheral region 200 in which metal wiring for the array of ferroelectric memory devices is provided. Generally, the field effect transistors 701 in the CMOS circuitry 700 may be electrically connected to an electrode of a respective ferroelectric memory cell by a respective set of metal interconnect structures.

Devices (such as field effect transistors 701) in the peripheral region 200 may provide functions that operate the array of ferroelectric memory cells to be subsequently formed. Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second line-and-via-level dielectric material layer 620, embodiments are expressly contemplated herein in which the array of memory cells may be formed at a different metal interconnect level.

An array of thin film transistors and an array of ferroelectric memory cells may be subsequently deposited over the dielectric material layers (601, 610, 620) that have formed therein the metal interconnect structures (612, 618, 622, 628). The set of all dielectric material layer that are formed prior to formation of an array of thin film transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an insulating matrix layer 635. The insulating matrix layer 635 includes a dielectric material such as undoped silicate glass, a doped silicate glass, organosilicate glass, or a porous dielectric material, and may be deposited by chemical vapor deposition. The thickness of the insulating matrix layer 635 may be in a range from 20 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The insulating matrix layer 635 may be formed over the interconnect-level dielectric layers.

Figure 2A:
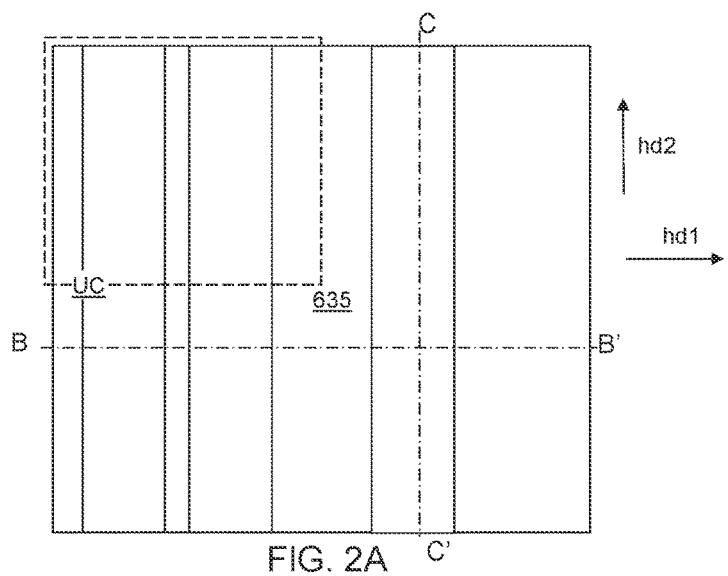
FIG. 2A is a top-down view of a portion of a memory array region of the first exemplary structure after formation of bottom gate trenches in an insulating matrix layer according to a first embodiment of the present disclosure.
Figure 2B:
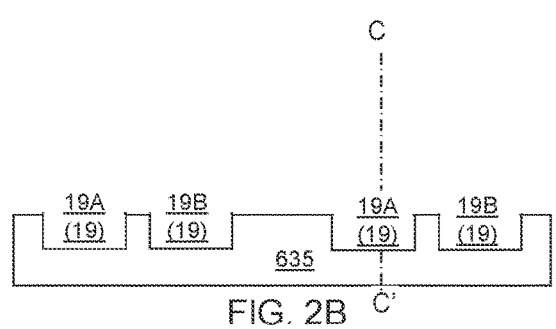
FIG. 2B is a vertical cross-sectional view of the first exemplary structure along the vertical plane B-B' of FIG. 2A.
Figure 2C:
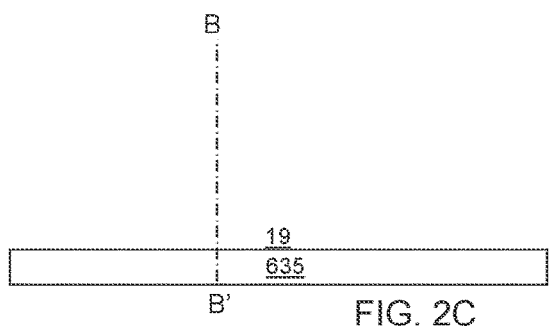
FIG. 2C is a vertical cross-sectional view of the first exemplary structure along the vertical plane C-C' of FIG. 2A.
Figure 4A:
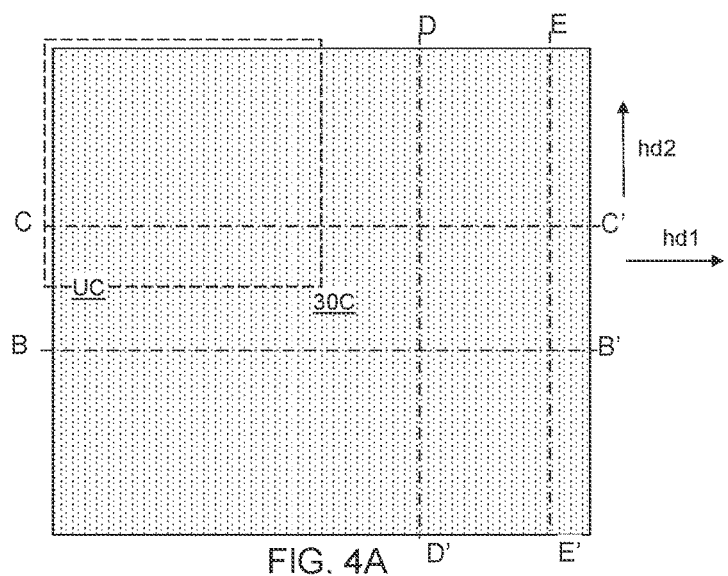
FIG. 4A is a top-down view of a portion of a memory array region of the first exemplary structure after formation of a continuous bottom gate dielectric layer, a continuous semiconducting metal oxide layer, and a continuous top gate dielectric layer according to the first embodiment of the present disclosure.
Figure 4B:
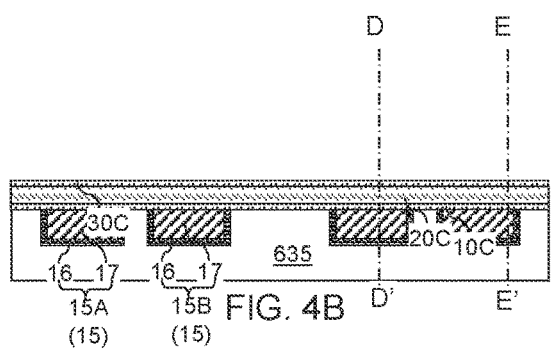
FIG. 4B is a vertical cross-sectional view of the first exemplary structure along the vertical plane B-B' of FIG. 4A.
Figure 4C:
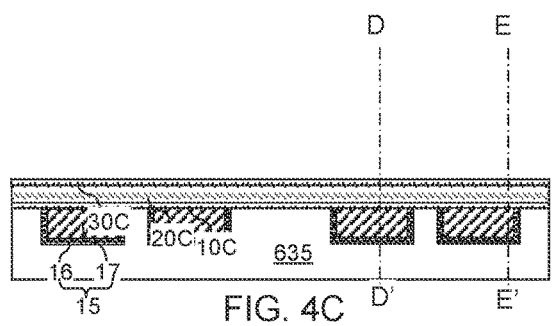
FIG. 4C is a vertical cross-sectional view of the first exemplary structure along the vertical plane C-C' of FIG. 4A.
Figure 5A:
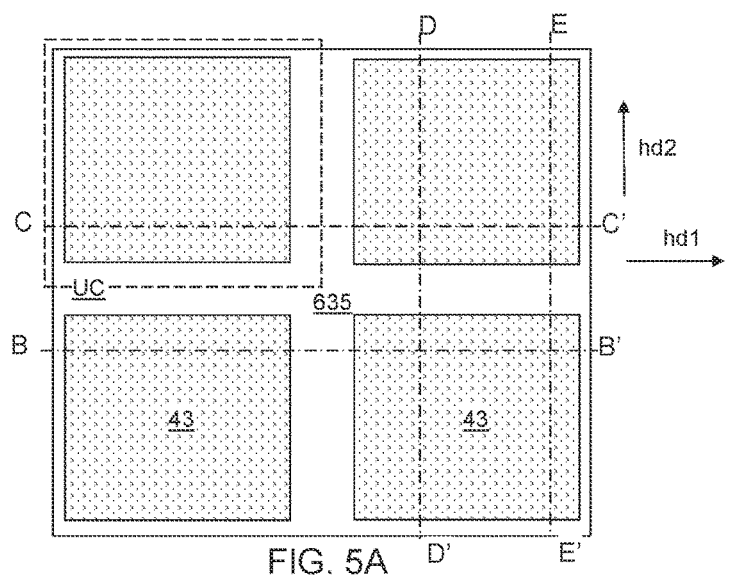
FIG. 5A is a top-down view of a portion of a memory array region of the first exemplary structure after patterning the lower continuous gate dielectric layer, the continuous semiconducting metal oxide layer, and the upper continuous gate dielectric layer into stacks of a bottom gate dielectric layer, a semiconducting metal oxide plate, and a top gate dielectric layer according to the first embodiment of the present disclosure.
Figure 5B:
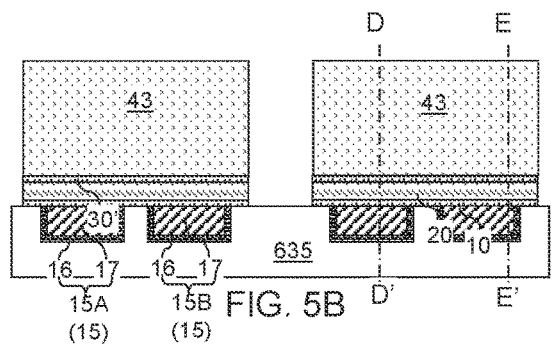
FIG. 5B is a vertical cross-sectional view of the first exemplary structure along the vertical plane B-B' of FIG. 5A.
Figure 5C:
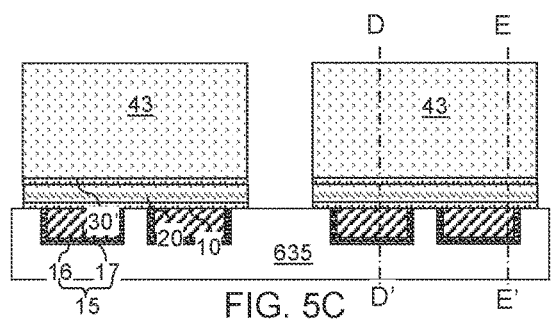
FIG. 5C is a vertical cross-sectional view of the first exemplary structure along the vertical plane C-C' of FIG. 5A.
Figure 5D:
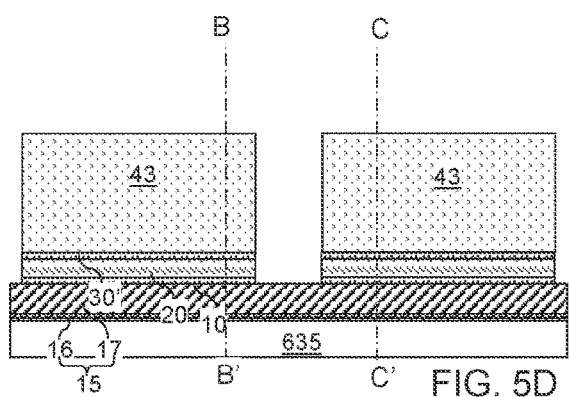
FIG. 5D is a vertical cross-sectional view of the first exemplary structure along the vertical plane D-D' of FIG. 5A.
Figure 5E:
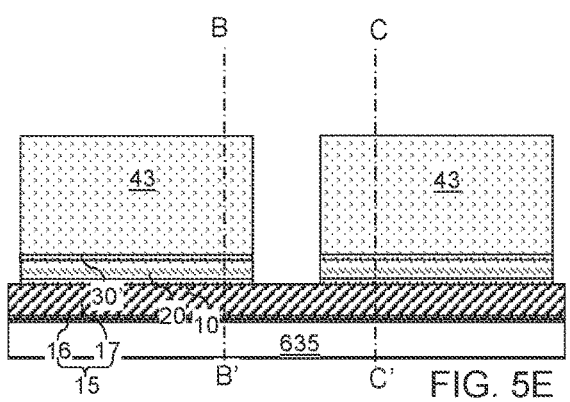
FIG. 5E is a vertical cross-sectional view of the first exemplary structure along the vertical plane E-E' of FIG. 5A.
Figure 6A:
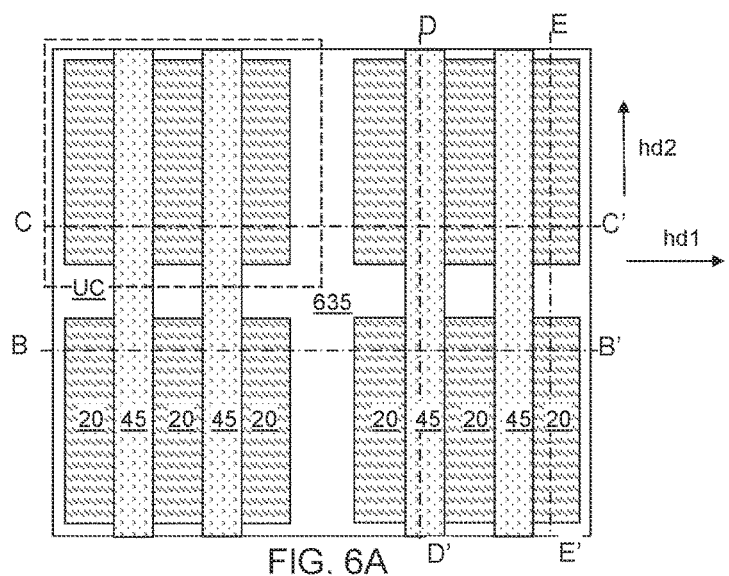
FIG. 6A is a top-down view of a portion of a memory array region of the first exemplary structure after patterning top gate dielectric layers into multiple top gate dielectrics according to the first embodiment of the present disclosure.
Figure 6B:
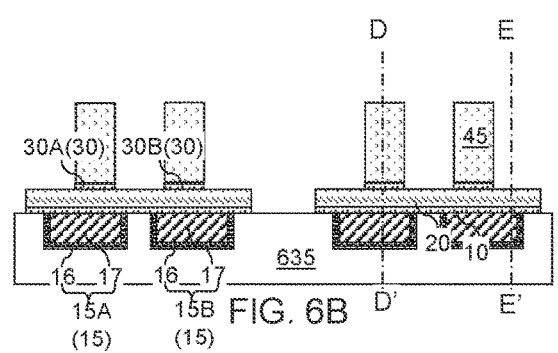
FIG. 6B is a vertical cross-sectional view of the first exemplary structure along the vertical plane B-B' of FIG. 6A.
Figure 6C:
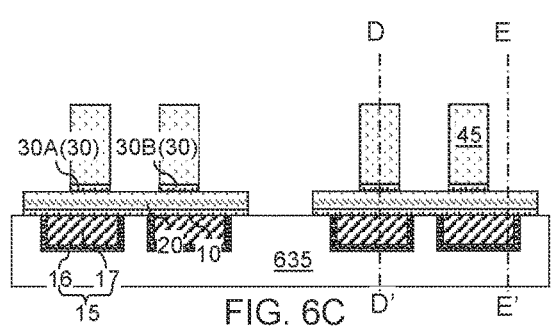
FIG. 6C is a vertical cross-sectional view of the first exemplary structure along the vertical plane C-C' of FIG. 6A.
Figure 6D:
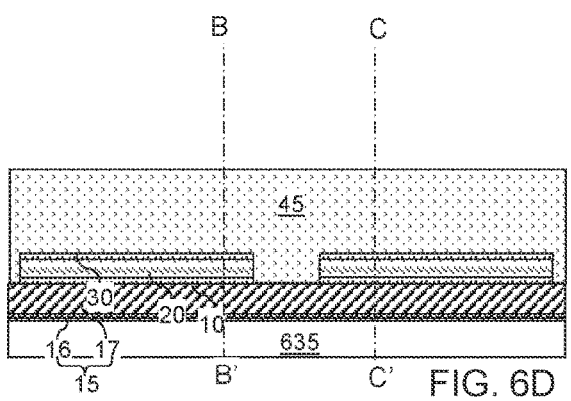
FIG. 6D is a vertical cross-sectional view of the first exemplary structure along the vertical plane D-D' of FIG. 6A.
Figure 6E:
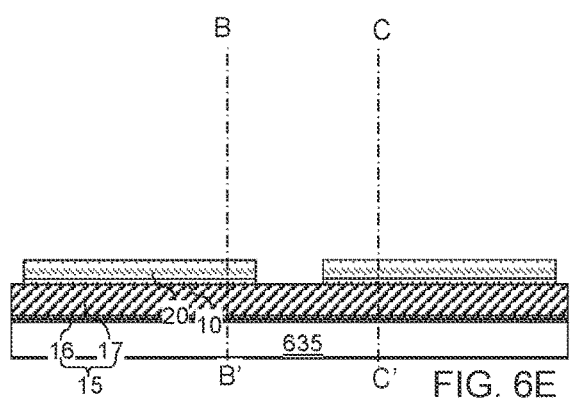
FIG. 6E is a vertical cross-sectional view of the first exemplary structure along the vertical plane E-E' of FIG. 6A.
Figure 7A:
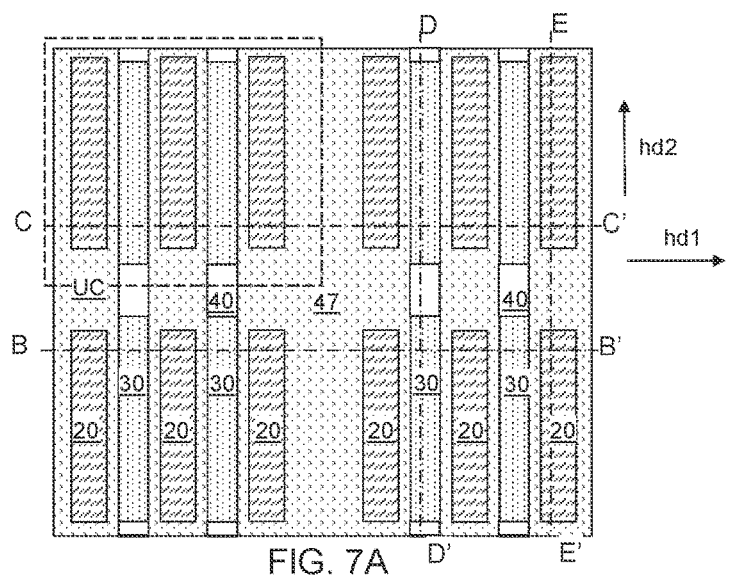
FIG. 7A is a top-down view of a portion of a memory array region of the first exemplary structure after formation of a TFT-level dielectric material layer, source cavities, top gate trenches, and drain cavities according to the first embodiment of the present disclosure.
Figure 7B:
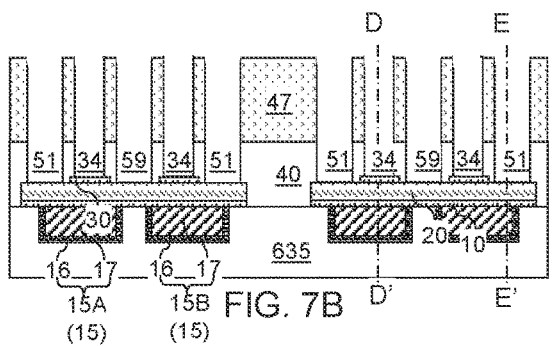
FIG. 7B is a vertical cross-sectional view of the first exemplary structure along the vertical plane B-B' of FIG. 7A.
Figure 7C:
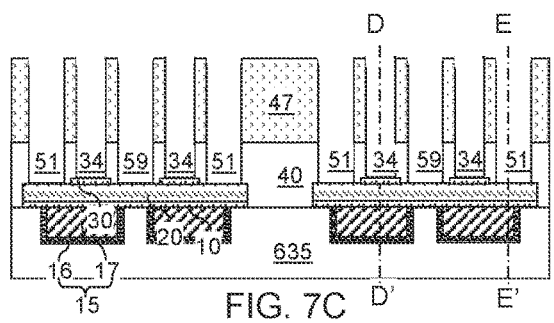
FIG. 7C is a vertical cross-sectional view of the first exemplary structure along the vertical plane C-C' of FIG. 7A.
Figure 7D:
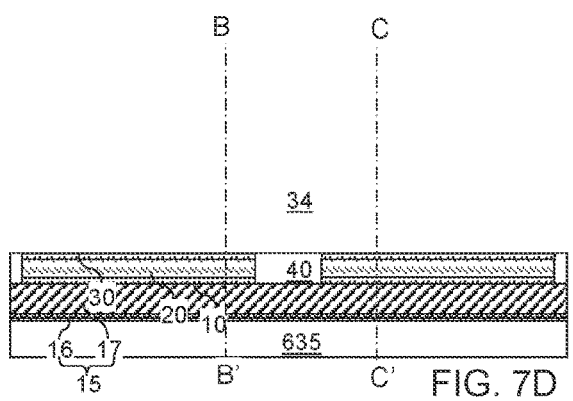
FIG. 7D is a vertical cross-sectional view of the first exemplary structure along the vertical plane D-D' of FIG. 7A.
Figure 7E:
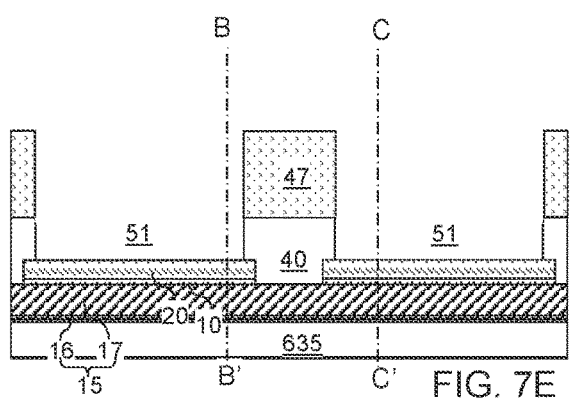
FIG. 7E is a vertical cross-sectional view of the first exemplary structure along the vertical plane E-E' of FIG. 7A.
Figure 8D:
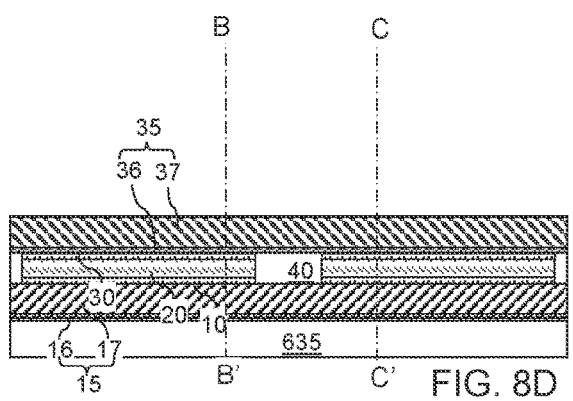
FIG. 8D is a vertical cross-sectional view of the first exemplary structure along the vertical plane D-D' of FIG. 8A.
Figure 8E:
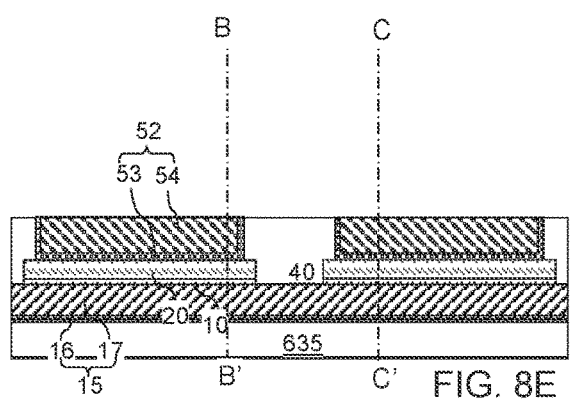
FIG. 8E is a vertical cross-sectional view of the first exemplary structure along the vertical plane E-E' of FIG. 8A.
Figure 9A:
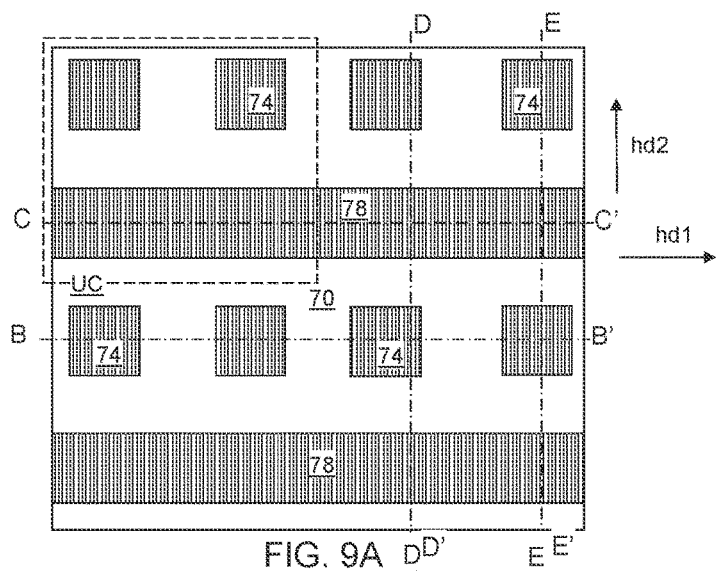
FIG. 9A is a top-down view of a portion of a memory array region of the first exemplary structure after formation of first upper-level dielectric material layers and first upper-level metal interconnect structures according to the first embodiment of the present disclosure.
Figure 9B:
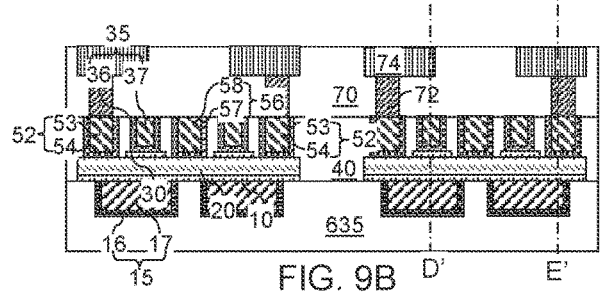
FIG. 9B is a vertical cross-sectional view of the first exemplary structure along the vertical plane B-B' of FIG. 9A.
Figure 9C:
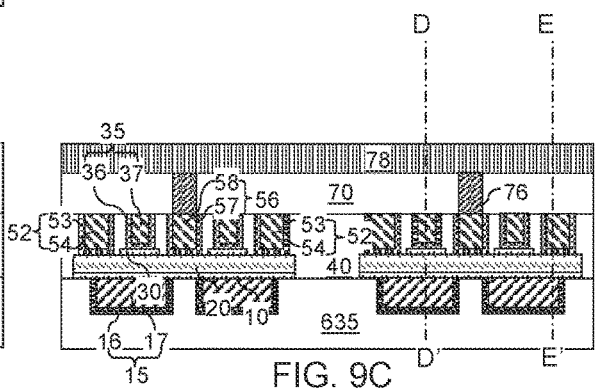
FIG. 9C is a vertical cross-sectional view of the first exemplary structure along the vertical plane C-C' of FIG. 9A.
Figure 9D:
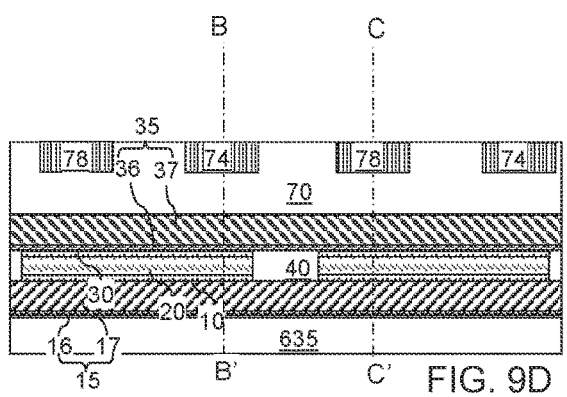
FIG. 9D is a vertical cross-sectional view of the first exemplary structure along the vertical plane D-D' of FIG. 9A.
Figure 9E:
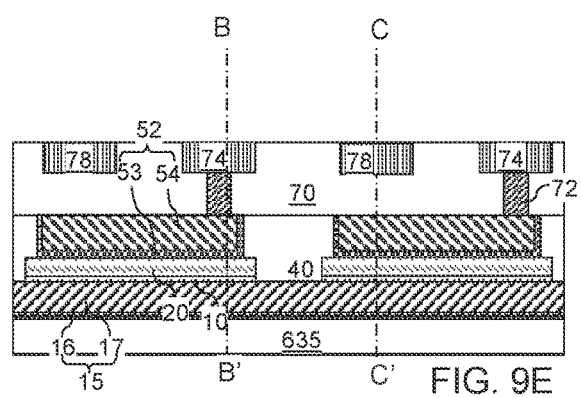
FIG. 9E is a vertical cross-sectional view of the first exemplary structure along the vertical plane E-E' of FIG. 9A.
Figure 10A:
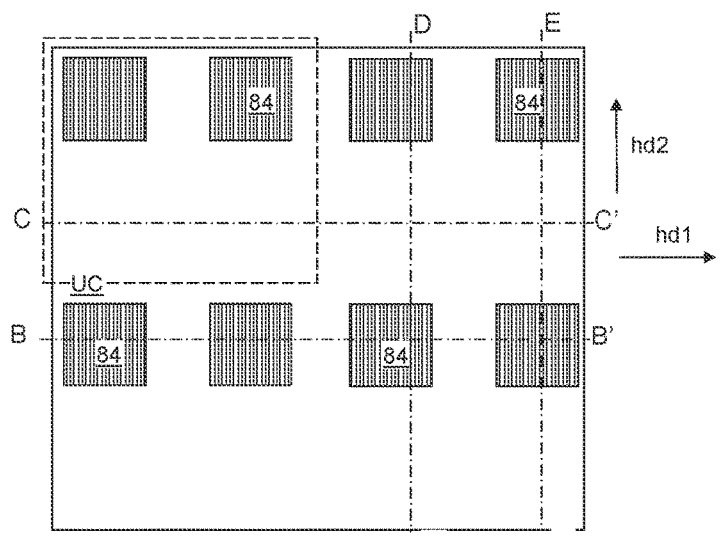
FIG. 10A is a top-down view of a portion of a memory array region of the first exemplary structure after formation of second upper-level dielectric material layers and second upper-level metal interconnect structures according to the first embodiment of the present disclosure.
Figure 10B:
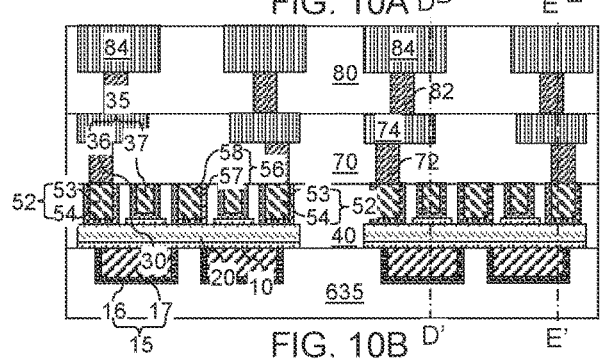
FIG. 10B is a vertical cross-sectional view of the first exemplary structure along the vertical plane B-B' of FIG. 10A.
Figure 10C:
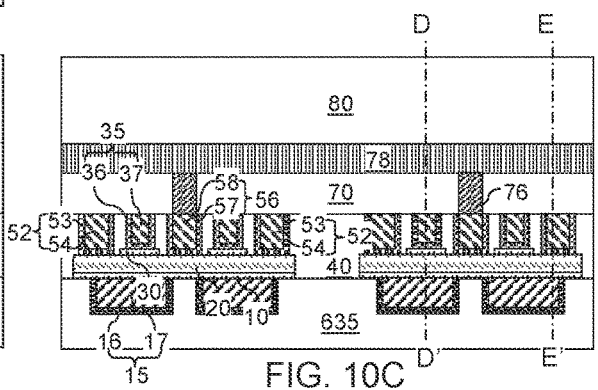
FIG. 10C is a vertical cross-sectional view of the first exemplary structure along the vertical plane C-C' of FIG. 10A.
Figure 10D:
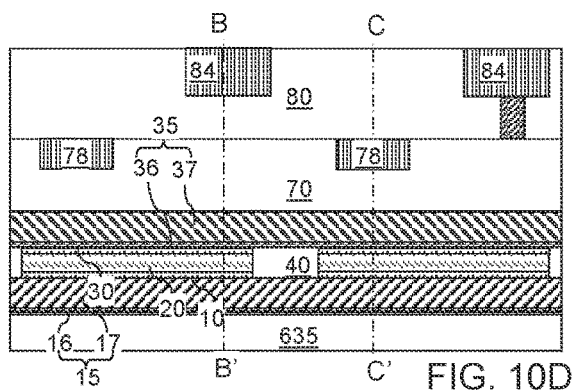
FIG. 10D is a vertical cross-sectional view of the first exemplary structure along the vertical plane D-D' of FIG. 10A.
Figure 10E:
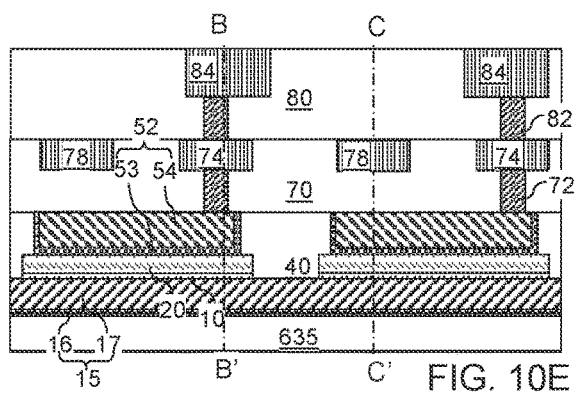
FIG. 10E is a vertical cross-sectional view of the first exemplary structure along the vertical plane E-E' of FIG. 10A.
Figure 11A:
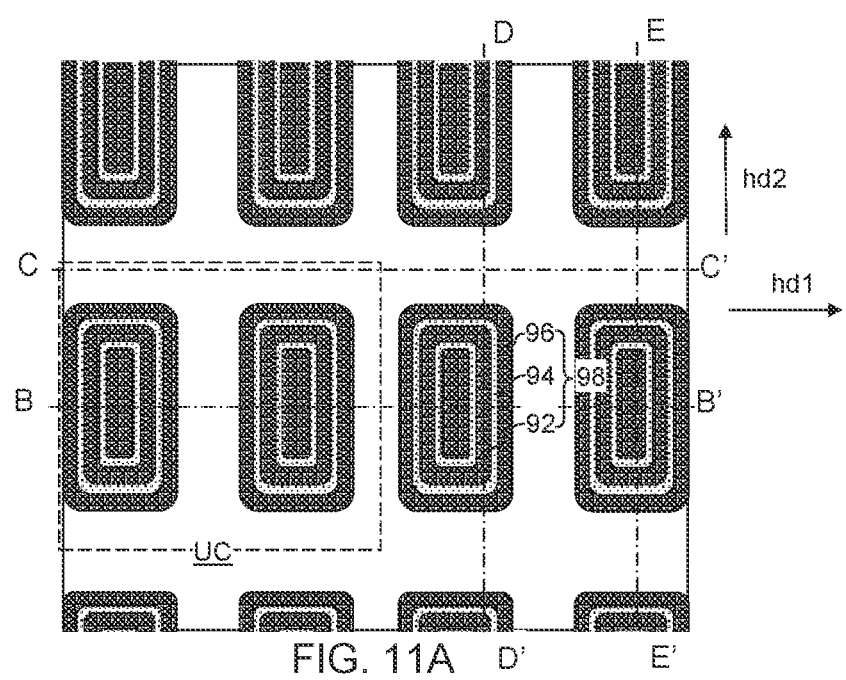
FIG. 11A is a top-down view of a portion of a memory array region of the first exemplary structure after formation of capacitor structures according to the first embodiment of the present disclosure. A capacitor-level dielectric material layer is not illustrated for clarity.
Figure 12D:
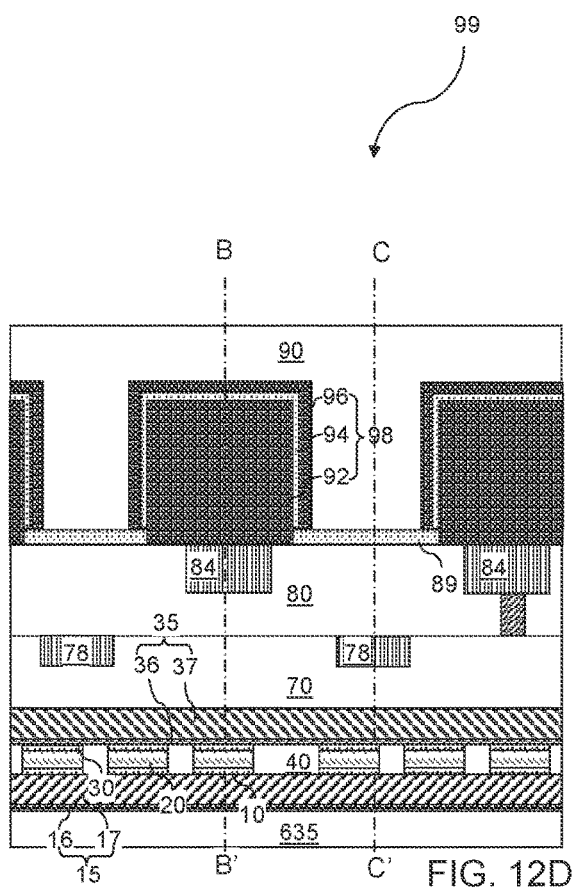
FIG. 12D is a vertical cross-sectional view of the alternative configuration of the first exemplary structure along the vertical plane D-D' of FIG. 12A.
Figure 12E:
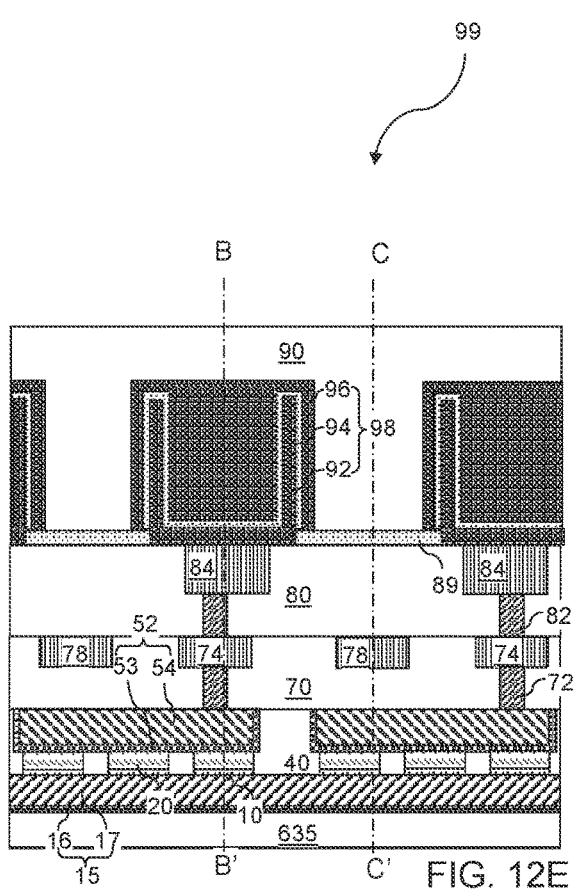
FIG. 12E is a vertical cross-sectional view of the alternative configuration of the first exemplary structure along the vertical plane E-E' of FIG. 12A.

Referring to FIGS. 2A-2C, a portion of a memory array region of the first exemplary structure is illustrated, which corresponds to the area of four unit cells UC of a two-dimensional array of dynamic random access memory cells. Instances of the unit cell UC may be repeated along the first horizontal direction hd1 and along the second horizontal direction hd2. Each unit cell UC may have an area for forming a pair of dynamic random access memory cells, each of which includes a series connection of a respective access transistor and a respective capacitor.

A photoresist layer (not shown) may be applied over a top surface of the insulating matrix layer 635, and may be lithographically patterned to form line-shaped openings that may be laterally spaced apart along a first horizontal direction hd1 and laterally extend along a second horizontal direction hd2 that is perpendicular to the first horizontal direction hd1. An anisotropic etch process may be performed to transfer the pattern of the line-shaped openings in the photoresist layer into an upper portion of the insulating matrix layer 635. Line trenches may be formed in an upper portion of the insulating matrix layer 635. The line trenches are herein referred to as bottom gate trenches 19, which include first bottom gate trenches 19A (which are first line trenches) and second bottom gate trenches 19B (which are second line trenches) that alternate along the first horizontal direction hd1. A first bottom gate trench 19A and a second bottom gate trench 19B extends through each unit cell UC. The first bottom gate trench 19A and the second bottom gate trench 19B laterally extend along the second horizontal direction hd2, and are laterally spaced apart along the first horizontal direction hd1.

In one embodiment, the width of each of the bottom gate trenches 19 along the first horizontal direction hd1 may be in a range from 20 nm to 300 nm, although lesser and greater widths may also be used. The depth of each of the bottom gate trenches 19 may be in a range from 20 nm to 150 nm, although lesser and greater depths may also be used. The width-to-height ratio of each bottom gate trench 19 may be in a range to 0.5 to 4, such as from 1 to 2, although lesser and greater ratios may also be used. The photoresist layer may be subsequently removed, for example, by ashing.

Referring to FIGS. 3A-3E, at least one conductive material may be deposited in the bottom gate trenches 19. The at least one conductive material may include, for example, a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. Excess portions of the at least one conductive material may be removed from above the horizontal plane including the top surface of the insulating matrix layer 635 by a planarization process, which may include a chemical mechanical polishing (CMP) process and/or a recess etch process. Bottom word lines 15 may be formed in the bottom gate trenches 19. The bottom word lines 15 may include first bottom word lines 15A that may be formed in the first bottom gate trenches 19A and second bottom word lines 15B that may be formed in the second bottom gate trenches 19B. Each of the bottom word lines 15 may include a lower metallic barrier liner 16 and a lower metallic gate material portion 17. Each lower metallic barrier liner 16 comprises a remaining portion of the metallic barrier liner material. Each lower metallic gate material portion 17 comprises a remaining portion of the metallic fill material. Generally, at least one conductive material may be deposited and planarized in the first line trenches 19A and the second line trenches 19B. Remaining portions of the at least one conductive material in the first line trenches 19A and the second line trenches 19B comprise first bottom word lines 15A and second bottom word lines 15B. Each first bottom word line 15A includes first gate electrodes, which are portions of a respective first bottom word line 15A that overlap with semiconducting metal oxide plates to be subsequently formed. Each second bottom word line 15A may include second gate electrodes, which are portions of a respective second bottom word line 15A that overlap with semiconducting metal oxide plates that may be subsequently formed.

Referring to FIGS. 4A-4E, a continuous bottom gate dielectric layer 10C, a continuous semiconducting metal oxide layer 20C, and a continuous top gate dielectric layer 30C may be sequentially deposited over the insulating matrix layer 635 and the bottom word lines 15.

The continuous bottom gate dielectric layer 10C may be formed over the insulating matrix layer 635 and the bottom word lines 15 by deposition of at least one gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the continuous bottom gate dielectric layer 10C may be in a range from 1 nm to 12 nm, such as from 2 nm to 6 nm, although lesser and greater thicknesses may also be used.

The continuous semiconducting metal oxide layer 20C may be deposited over the continuous bottom gate dielectric layer 10C. In one embodiment, the semiconducting material includes a material providing electrical conductivity in a range from 1.0 S/m to $1.0 \times 10^5$ S/m upon suitable doping with electrical dopants (which may be p-type dopants or n-type dopants). Exemplary semiconducting materials that may be used for the continuous semiconducting metal oxide layer 20C include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Other suitable semiconducting materials are within the contemplated scope of disclosure. In one embodiment, the semiconducting material of the continuous semiconducting metal oxide layer 20C may include indium gallium zinc oxide.

The continuous semiconducting metal oxide layer 20C may include a polycrystalline semiconducting material, or an amorphous semiconducting material that may be subsequently annealed into a polycrystalline semiconducting material having a greater average grain size. The continuous semiconducting metal oxide layer 20C may be deposited by physical vapor deposition although other suitable deposition processes may be used. The thickness of the continuous semiconducting metal oxide layer 20C may be in a range from 1 nm to 100 nm, such as from 2 nm to 50 nm and/or from 4 nm to 15 nm, although lesser and greater thicknesses may also be used.

The continuous top gate dielectric layer 30C may be formed over the continuous semiconducting metal oxide layer 20C by deposition of at least one gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The gate dielectric material may be deposited by atomic layer deposition or chemical vapor deposition although other suitable deposition processes may be used. The thickness of the continuous top gate dielectric layer 30C may be in a range from 1 nm to 12 nm, such as from 2 nm to 6 nm, although lesser and greater thicknesses may also be used.

Referring to FIGS. 5A-5E, a photoresist layer 43 may be applied over the continuous top gate dielectric layer 30C, and may be lithographically patterned to form discrete patterned photoresist material portion. Each patterned portion of the photoresist layer 43 may be located within the area of a respective one of the unit cells UC. The area of each patterned portion of the photoresist layer 43 may define the area of a semiconducting metal oxide portion to be subsequently patterned from the continuous semiconducting metal oxide layer 20C. In one embodiment, each patterned portion of the photoresist layer 43 may have a horizontal cross-sectional shape of a rectangle or a rounded rectangle.

The pattern in the photoresist layer 43 may be transferred through the continuous top gate dielectric layer 30C, the continuous semiconducting metal oxide layer 20C, and the continuous bottom gate dielectric layer 10C by performing an anisotropic etch process. Patterned portions of the continuous top gate dielectric layer 30C may comprise a two-dimensional array of top gate dielectric layers 30'. Patterned portion of the continuous semiconducting metal oxide layer 20C comprise a two-dimensional array of semiconducting metal oxide plates 20. Patterned portion of the continuous bottom gate dielectric layer 10C comprise a two-dimensional array of bottom gate dielectric layers 10. A two dimensional array of layer stacks of a bottom gate dielectric layer 10, a semiconducting metal oxide plate 20, and a top gate dielectric layer 30' may be formed. Sidewalls of the bottom gate dielectric layer 10, the semiconducting metal oxide plate 20, and the top gate dielectric layer 30' within each layer stack may be vertically coincident, i.e., may be located within a same vertical plane. The photoresist layer 43 may be subsequently removed, for example, by ashing.

In one embodiment, each semiconducting metal oxide plate 20 may have a horizontal cross-sectional shape of a rectangle or a rounded rectangle. In one embodiment, each semiconducting metal oxide plate 20 may have a lateral dimension along the first horizontal direction hd1 in a range from 60 nm to 1,000 nm, such as from 100 nm to 300 nm, although lesser and greater lateral dimensions may also be used. In one embodiment, each semiconducting metal oxide plate 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each semiconducting metal oxide plate 20 may be in a range from 0.5 to 4, such as from 1 to 2, although lesser and greater ratios may also be used.

Generally, at least one continuous gate dielectric layer (10C, 30C) and a continuous semiconducting metal oxide layer 20C may be formed over first gate electrodes comprising portions of the first bottom word lines 15A and over second gate electrodes comprising portions of the second bottom word lines 15B. The at least one continuous gate dielectric layer (10C, 30C) and the continuous semiconducting metal oxide layer 20C may be patterned into gate dielectric layers (10, 30') and semiconducting metal oxide plates 20. Each bottom gate dielectric layer 10 may include a first gate dielectric having an areal overlap with an underlying first bottom word line 15A and a second gate dielectric having an areal overlap with an underlying second bottom word lines 15B. Generally, a first gate dielectric a second gate dielectric may be provided as portions of a bottom gate dielectric layer 10 that have an areal overlap with a first bottom word line 15A or with a second bottom word line 15B.

Generally, a semiconducting metal oxide plate 20 may be formed over lower-level dielectric material layers (601, 610, 620) that overlies a substrate 8. A first gate dielectric (comprising a first portion of a bottom gate dielectric layer 10) may contacts a first portion of a bottom surface of the semiconducting metal oxide plate 20. A first gate electrode (comprising an aerial portion of a first bottom word line 15A) contacts a bottom surface of the first gate dielectric. A second gate dielectric (comprising a second portion of the bottom gate dielectric layer 10) may contacts a second portion of the bottom surface of the semiconducting metal oxide plate 20. A second gate electrode (comprising a portion of a second bottom word line 15B) contacts a bottom surface of the second gate dielectric.

The first gate electrode comprises a portion of a first bottom word line 15A having an areal overlap with the semiconducting metal oxide plate 20 in a plan view, and the second gate electrode comprises a portion of a second bottom word line 15B having an areal overlap with the semiconducting metal oxide plate 20 in the plan view. The first bottom word line 15A and the second bottom word line 15B laterally extend along the second horizontal direction hd2 that is perpendicular to the first horizontal direction hd1.

Referring to FIGS. 6A-6E, a photoresist layer 45 may be applied over the first exemplary structure, and may be lithographically patterned to form line-shaped photoresist material portions that laterally extend along the second horizontal direction hd1 an laterally spaced apart along the first horizontal direction hd1. The areas of the line-shaped photoresist material portions may overlap with the area of the first bottom word line 15A and the second bottom word line 15B, and may be located entirely within the areas of the first bottom word line 15A and the second bottom word line 15B. In one embodiment, the line-shaped photoresist material portions may have a lesser width along the first horizontal direction hd1 than the first bottom word line 15A and the second bottom word line 15B.

An etch process may be performed to remove unmasked portions of the top gate dielectric layers 30' without removing the material of the semiconducting metal oxide plates 20. An anisotropic etch process or an isotropic etch process may be used. A patterned portions of a top gate dielectric layer 30' that overlies a first bottom word line 15A comprises a first top gate dielectric 30A, and a patterned portion of a top gate dielectric layer 30' that overlies a second bottom word line 15B comprises a second top gate dielectric 30B. The first top gate dielectrics 30A and the second top gate dielectrics 30B are collectively referred to as top gate dielectrics 30. The photoresist layer 45 may be subsequently removed, for example, by ashing.

Referring to FIGS. 7A-7E, a dielectric material layer may be deposited over a two-dimensional array of combinations of a bottom gate dielectric layer 10, a semiconducting metal oxide plate 20, a first top gate dielectric 30A, and a second top gate dielectric 30B. The dielectric material layer is herein referred to as a thin-film-transistor-level (TFT-level) dielectric material layer 40, i.e., a dielectric material layer that is located at the level of thin film transistors. The TFT-level dielectric material layer 40 includes a dielectric material such as undoped silicate glass, a doped silicate glass, organosilicate glass, or a stack thereof. Optionally, the TFT-level dielectric material layer 40 may be planarized to provide a flat top surface. The thickness of the TFT-level dielectric material layer 40, as measured from an interface with the insulating matrix layer 635, may be in a range from 100 nm to 1,000 nm, such as from 200 nm to 500 nm, although lesser and greater thicknesses may also be used.

A photoresist layer 47 may be applied over the TFT-level dielectric material layer 40, and may be lithographically patterned to form line trenches and discrete openings therein. The pattern of the line trenches and the discrete openings in the photoresist layer 47 may be transferred through the TFT-level dielectric material layer 40 to form top gate trenches 34, source cavities 51, and drain cavities 59.

The top gate trenches 34 may laterally extend along the second horizontal direction hd2 and may straddle over multiple top gate dielectrics 30 that are located on multiple semiconducting metal oxide plates 20. The top gate trenches 34 may have a respective uniform width along the first horizontal direction hd1, which may be, for example, in a range from 10 nm to 250 nm, such as from 30 nm to 150 nm, although lesser and greater widths may also be used. The width of the top gate trenches 34 may be less than the width of the top gate dielectrics 30 to avoid physical exposure of a top surface of a semiconducting metal oxide plate 20 underneath the top gate trenches 34. Each top gate trench 34 may be formed over a respective one of the bottom word lines 15. For example, first top gate trenches 34 may be formed over first bottom word lines 15A, and second top gate trenches 34 may be formed over second bottom word lines 15B. Thus, a pair of top gate trenches 34 straddle each semiconducting metal oxide plate 20 along the second horizontal direction hd2. Top surfaces of a row of top gate dielectrics 30 may be physically exposed at the bottom of each top gate trench 34.

A pair of source cavities 51 may be formed over each semiconducting metal oxide plate 20. Specifically, the pair of source cavities 51 may be formed at end portions of a respective one of the semiconducting metal oxide plates 20 that are laterally spaced apart along the first horizontal direction hd1. Thus, the pair of source cavities 51 may be laterally spaced apart by a pair of top gate trenches 34 that straddle the respective one of the semiconducting metal oxide plates 20. The area of each source cavity 51 may be entirely within the area of an underlying semiconducting metal oxide plate 20. A portion of a top surface of a semiconducting metal oxide plate 20 may be physically exposed at the bottom of each source cavity 51.

A drain cavity 59 may be formed over each semiconducting metal oxide plate 20 between a respective pair of top gate trenches 34. A portion of a top surface of a semiconducting metal oxide plate 20 may be physically exposed at the bottom of each drain cavity 59.

Generally, a set of cavities (51, 34, 59) may be formed through the TFT-level dielectric material layer 40 down to a top surface of each semiconducting metal oxide plate 20. The set of cavities (51, 34, 59) may comprise, from one side to another along the first horizontal direction hd1, a first source cavity 51, a first top gate trench 34, a drain cavity 59, a second top gate trench 34, and a second source cavity 51. The photoresist layer 47 may be subsequently removed, for example, by ashing.

Referring to FIGS. 8A-8E, at least one conductive material may be deposited in the cavities (51, 34, 59) and over the TFT-level dielectric material layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric material layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a top gate trench 34 constitutes a top word lines 35 including top gate electrodes for underlying semiconducting metal oxide plates 20.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each top word line 35 may include a gate metallic liner 36 that is a remaining portion of the metallic liner material, and a gate metallic fill material portion 37 that is a remaining portion of the metallic fill material.

Generally, a first source electrode 52, a first top word line 35 including a first top gate electrode, a drain electrode 56, a second top word line 35 including a second top gate electrode, and a second source electrode 52 may be formed on a respective portion of a top surface of each semiconducting metal oxide plate 20. The drain electrode 56 is formed between a first gate structure (which may comprise a combination of a first bottom gate dielectric and a first bottom gate electrode, or as a combination of a first top gate dielectric 30A and a first top gate electrode including a portion of a first top word line 35) and a second gate structure (which may comprise a combination of a second bottom gate dielectric and a second bottom gate electrode, or as a combination of a second top gate dielectric 30B and a second top gate electrode including a portion of a second top word line 35). The first source electrode 52 is laterally spaced from the drain electrode 56 by the first gate structure {(15A, 10) or (30, 35)}, and the second source electrode 52 is laterally spaced from the drain electrode 56 by the second gate structure {(15A, 10) or (30, 35)}.

Generally, a first thin film transistor and a second thin film transistor may be formed in each unit cell UC. The first thin film transistor and the second thin film transistor comprise a semiconducting metal oxide plate 20 located over a substrate 8 as a continuous material portion, and a set of electrode structures (52, 15, 35, 56) located on the semiconducting metal oxide plate 20 and comprising, from one side to another along a first horizontal direction hd1, a first source electrode 52, a first gate electrode (15 or 35), a drain electrode 56, a second gate electrode (15 or 35), and a second source electrode 52. The first gate electrode (15 or 35) and the second gate electrode (15 or 35) may be spaced from the semiconducting metal oxide plate 20 by a first gate dielectric (which may be a first portion of a bottom gate dielectric layer 10 or a first top gate dielectric 30A) and a second gate dielectric (which may be a second portion of the bottom gate dielectric layer 10 or a second top gate dielectric 30B), respectively. A first portion of the semiconducting metal oxide plate 20 laterally extending between the first source electrode 52 and the drain electrode 56 comprises a first semiconductor channel, and a second portion of the semiconducting metal oxide plate 20 laterally extending between the second source electrode 52 and the drain electrode 56 comprises a second semiconductor channel.

The semiconducting metal oxide plate 20 and the set of electrode structures (52, 15, 35, 56) may be formed within a TFT-level dielectric material layer 40. Top surfaces of the first source electrode 52, the drain electrode 56, and the second source electrode 52 may be located within a horizontal plane (i.e., co-planar) including a top surface of the TFT-level dielectric material layer 40.

In one embodiment, the bottom word lines 15 may be omitted and the top word lines 35 may be present. In this embodiment, the bottom gate dielectric layers 10 may also be omitted. In another embodiment, the top word lines 35 may be omitted and the bottom word lines 15 may be present. In this embodiment, the top gate dielectrics 30 may also be omitted. In yet another embodiment, the bottom word lines 15 and the top word lines 35 may be present.

In embodiments in which the bottom word lines 15 and the top word lines 35 are present, the bottom gate dielectric layers 10 and the top gate dielectrics 30 are present. In this embodiment, first gate dielectrics may be provided as first portions of a respective bottom gate dielectric layer 10 having an areal overlap with first bottom word lines 15A, and second gate dielectrics may be provided as portions of a respective bottom gate dielectric layer 10 having an areal overlap with second bottom word lines 15B. An additional first gate dielectric and an additional second gate dielectric may be provided for each semiconducting metal oxide plate 20. The additional first gate dielectric comprise a first top gate dielectric 30A, and the additional second gate dielectric may comprise a second top gate dielectric 30B. The additional first gate dielectric contacts a first portion of a top surface of the semiconducting metal oxide plate 20, and an additional first gate electrode (comprising a portion of a first top word line 35) may contact a top surface of the additional first gate dielectric. The additional second gate dielectric contacts a second portion of a top surface of the semiconducting metal oxide plate 20, and an additional second gate electrode (comprising a portion of a second top word line 35) may contact a top surface of the additional second gate dielectric.

In one embodiment, each of the first source electrode 52, the first additional gate electrode (such as a portion of a first top word line 35), the drain electrode 56, the second additional gate electrode (such as a portion of a second top word line 35), and the second source electrode 52 may have a respective top surface located within a horizontal plane including the top surface of a TFT-level dielectric material layer 40 that has formed therein the semiconducting metal oxide plate 20. In one embodiment, each of the first source electrode 52, the first additional gate electrode (such as a portion of a first top word line 35), the drain electrode 56, the second additional gate electrode (such as a portion of a second top word line 35), and the second source electrode 52 may comprise a combination of a respective metallic barrier liner (53, 36, 57) having a first material composition and a respective metallic fill material portion (54, 37, 58) having a second material composition.

Generally, a contiguous combination of a gate dielectric and a gate electrode comprising a portion of a word line constitutes a gate structure. A first gate structure and a second gate structure may be formed prior to, and/or after, formation of the semiconducting metal oxide plate 20 within each unit cell UC. The first gate structure and the second gate structure are laterally spaced apart along the first horizontal direction hd1. The first gate structure comprises a first gate dielectric (comprising a first portion of a bottom gate dielectric layer 10 or as a first top gate dielectric 30) and a first gate electrode (comprising a portion of a bottom word line 15 or a top word line 35), and the second gate structure comprises a second gate dielectric (comprising a second portion of a bottom gate dielectric layer 10 or as a second top gate dielectric 30) and a second gate electrode (comprising a portion of a bottom word line 15 or a top word line 35).

Referring to FIGS. 9A-9E, at least one first upper-level dielectric material layer 70 and first upper-level metal interconnect structures (72, 74, 76, 78) may be formed over the TFT-level dielectric material layer 40. The at least one first upper-level dielectric material layer 70 may include a first via-level dielectric material layer having formed therein source contact via structures 72 and drain contact via structures 76, and a first line-level dielectric material layer having formed therein first source connection pads 74 and bit lines 78. In this embodiment, the first via-level dielectric material layer may be formed first, and the source contact via structures 72 and the drain contact via structures 76 may be formed through the first via-level dielectric material layer.

The first line-level dielectric material layer may be subsequently formed over the first via-level dielectric material layer, and the first source connection pads 74 and the bit lines 78 may be subsequently formed through the first line-level dielectric material layer on a respective one of the source contact via structures 72 and the drain contact via structures 76.

Alternatively, the first via-level dielectric material layer and the first line-level dielectric material layer may be formed as a single dielectric material layer, and a dual damascene process may be performed to form integrated line and via structures. The integrated line and via structures include source-side integrated line and via structures including a respective combination of a source contact via structure 72 and a first source connection pad 74, and drain-side integrated line and via structures including a respective combination of drain contact via structures 72 and a bit line 78 that is integrally formed within the drain contact via structures 72. Generally, each bit line 78 laterally extends along the first horizontal direction hd1 and may be electrically connected to a set of drain electrodes 56 that are arranged along the first horizontal direction hd1.

Referring to FIGS. 10A-10E, at least one second upper-level dielectric material layer 80 and second upper-level metal interconnect structures (82, 84) may be formed over the at least one first upper-level dielectric material layer 70. The at least one second upper-level dielectric material layer 80 may include a second via-level dielectric material layer having formed therein source connection via structures 82, and a second line-level dielectric material layer having formed therein second source connection pads 84. In this embodiment, the second via-level dielectric material layer may be formed, and the source contact via structures 82 may be formed through the second via-level dielectric material layer. The second line-level dielectric material layer may be subsequently formed over the second via-level dielectric material layer, and the second source connection pads 84 may be subsequently formed through the second line-level dielectric material layer on a respective one of the source connection via structures 82.

Alternatively, the second via-level dielectric material layer and the second line-level dielectric material layer may be formed as a single dielectric material layer, and a dual damascene process may be performed to form integrated line and via structures. The integrated line and via structures include source-side integrated line and via structures including a respective combination of a source connection via structure 82 and a second source connection pad 84.

Generally, upper-level dielectric material layers (70, 80) may be formed over the TFT-level dielectric material layer 40. Source-connection metal interconnect structures (72, 74, 82, 84) may be formed within the upper-level dielectric material layers (70, 80), which may be used to electrically connect each of the source electrodes 52 to a conductive node of a respective capacitor structure to be subsequently formed. Within each unit cell UC, first source-connection metal interconnect structures (72, 74, 82, 84) may be used to provide electrical connection between a first source electrode 52 to a first conductive node of a first capacitor structure to be subsequently formed, and second source-connection metal interconnect structures (72, 74, 82, 84) may be used to provide electrical connection between a second source electrode 52 and a second conductive node of a second capacitor structure to be subsequently formed.

Referring to FIGS. 11A-11E, capacitor structures 98 formed within a capacitor-level dielectric material layer 90 may be formed. For example, first capacitor plates 92 may be formed on top surfaces of the second source connection pads 84 by deposition and patterning a first conductive material, which may be a metallic material or a heavily doped semiconductor material. Optionally, a dielectric etch stop layer 89 may be formed on a top surface of the second upper-level dielectric material layer 80. A node dielectric 94 may be formed on each first capacitor plate 92 by deposition of a node dielectric material such as silicon oxide and/or a dielectric metal oxide (e.g., aluminum oxide, lanthanum oxide, and/or hafnium oxide). A second capacitor plate 96 may be formed on physically exposed surfaces of the node dielectric by deposition and pattering of a second conductive material, which may be a metallic material or a heavily doped semiconductor material.

Each contiguous combination of a first capacitor plate 92, a node dielectric 94, and a second capacitor plate 96 may constitute a capacitor structure 98. A pair of capacitor structures 98 may be formed within each unit cell UC. Thus, a first capacitor structure 98 and a second capacitor structure 98 may be formed within each unit cell UC. A first conductive node (such as a first capacitor plate 92) of the first capacitor structure 98 is electrically connected to an underlying first source electrode 52, and a second conductive node (such as another first capacitor plate 92) of the second capacitor structure 98 is electrically connected to an underlying second source electrode 92.

Generally, the field effect transistors 701 located on the substrate 8 may be electrically connected to the various nodes of the thin film transistors formed within the TFT-level dielectric material layer 40. A subset of the field effect transistors 701 may be electrically connected to at least one of the drain electrodes 56, the first gate electrodes (comprising portions of bottom word lines 15 and/or as portions of top word lines 35), and the second gate electrodes (comprising portions of bottom word lines 15 and/or as portions of top word lines 35). A bottom surface of a first conductive node of a first capacitor structure 98 may contact a top surface of a respective one of the first source-connection metal interconnect structures (72, 74, 82, 84). A bottom surface of a second conductive node of a second capacitor structure 98 may contact a top surface of a respective one of the second source-connection metal interconnect structures (72, 74, 82, 84).

The capacitor-level dielectric material layer 90 may be formed over the capacitor structures 98. Each of the capacitor structures 98 may be formed within, and laterally surrounded by, the capacitor-level dielectric material layer 90, which is one of the upper-level dielectric material layers (70, 80, 90).

In one embodiment, each of the first capacitor plates 92 may be electrically connected to (i.e., electrically shorted to) a respective one of the source electrodes 52. Each of the second capacitor plates 96 may be electrically grounded, for example, by forming an array of conductive via structures (not shown) that contact the second capacitor plates 96 and connected to an overlying metallic plate (not shown).

Referring to FIGS. 12A-12E, a memory array region of an alternative configuration of the first exemplary structure is illustrated after formation of capacitor structures according to the first embodiment of the present disclosure. The alternative configuration of the first exemplary structure may be derived from the first exemplary structure illustrated in FIGS. 12A-12E by modifying the patterning process illustrated in FIGS. 5A-5E. Specifically, a set of multiple semiconducting metal oxide plates 20 that are laterally spaced apart along the second horizontal direction hd2 may be formed in each unit cell UC in lieu of a single semiconducting metal oxide plate 20. Each semiconducting metal oxide plate 20 within a set of multiple semiconducting metal oxide plates 20 may have a respective horizontal cross-sectional shape of a rectangle or a rounded rectangle.

Thus, each source electrode 52 may contact end portions of top surfaces of the set of semiconducting metal oxide plates 20, and each drain electrode 56 may contact middle portions of top surfaces of the set of semiconducting metal oxide plates 20. Each gate electrode (which may comprise a portion of a bottom word line 15 or as a portion of a top word line 35) may straddle each semiconducting metal oxide plate 20 within the set of semiconducting metal oxide plates 20.

Figure 13:
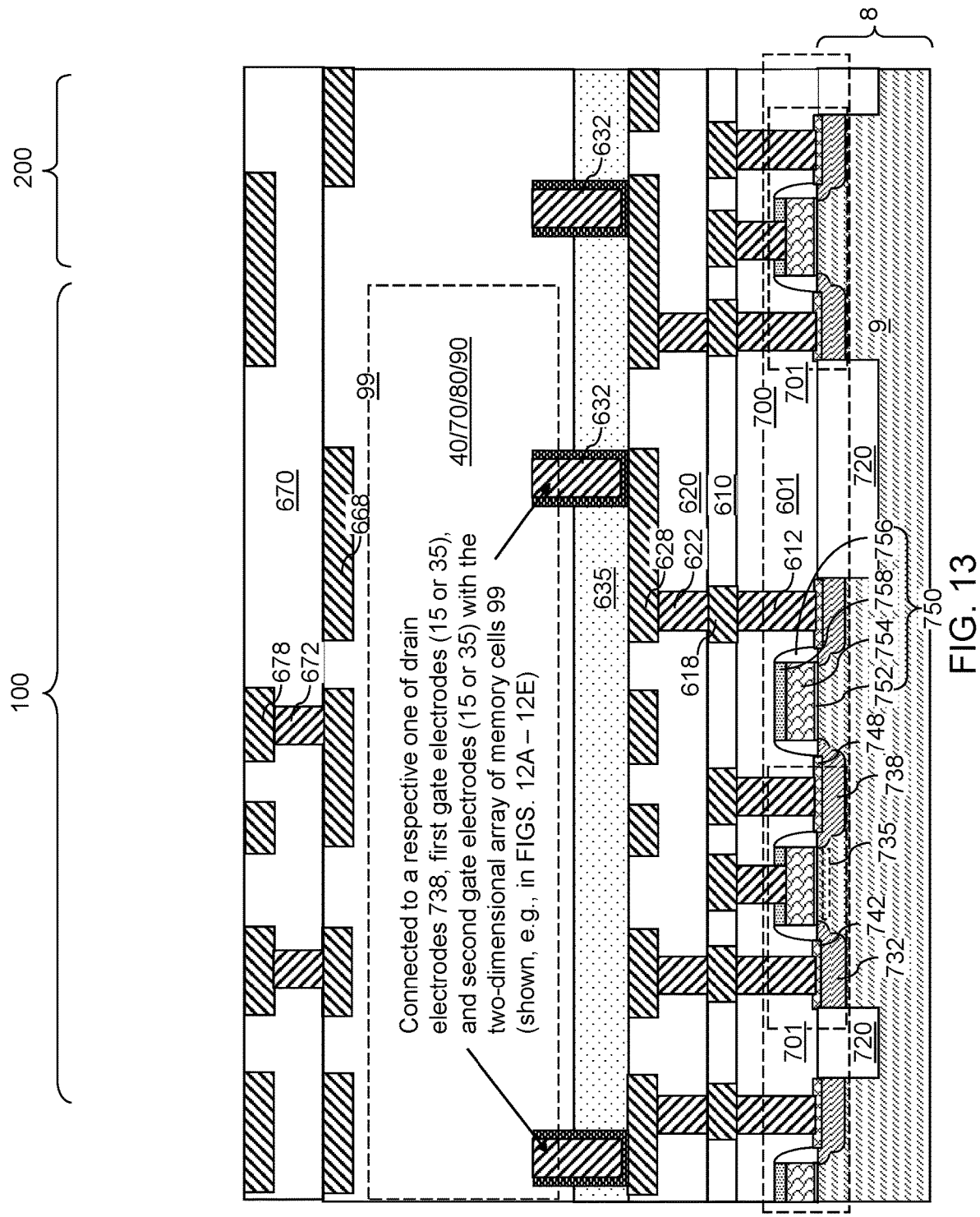
FIG. 13 is a vertical cross-sectional view of the first exemplary structure after formation of additional upper-level dielectric material layers and additional upper-level metal interconnect structures according to the first embodiment of the present disclosure.
Figure 14A:
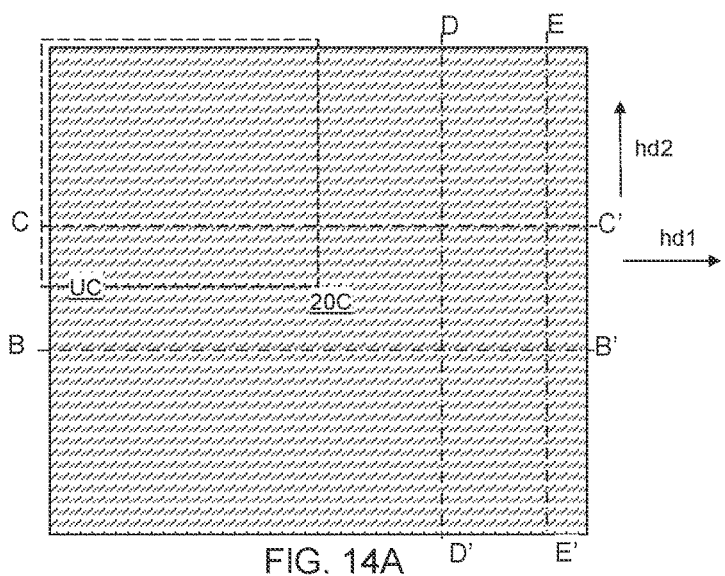
FIG. 14A is a top-down view of a portion of a memory array region of a second exemplary structure after formation of a continuous bottom gate dielectric layer and a continuous semiconducting metal oxide layer according to the second embodiment of the present disclosure.
Figure 14B:
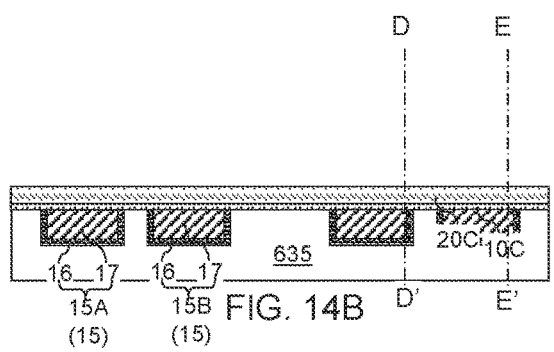
FIG. 14B is a vertical cross-sectional view of the second exemplary structure along the vertical plane B-B' of FIG. 14A.
Figure 14C:
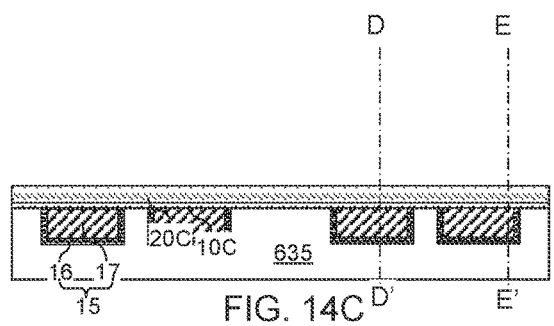
FIG. 14C is a vertical cross-sectional view of the second exemplary structure along the vertical plane C-C' of FIG. 14A.
Figure 14D:
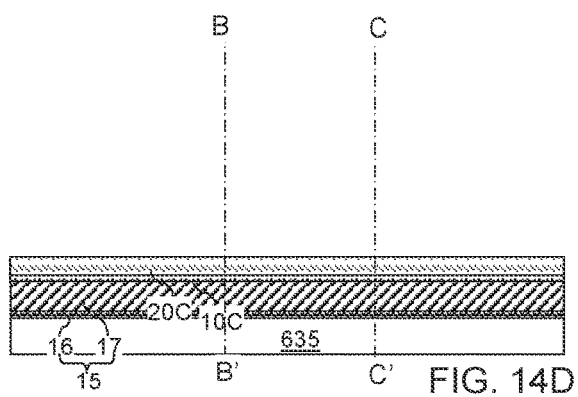
FIG. 14D is a vertical cross-sectional view of the second exemplary structure along the vertical plane D-D' of FIG. 14A.
Figure 14E:
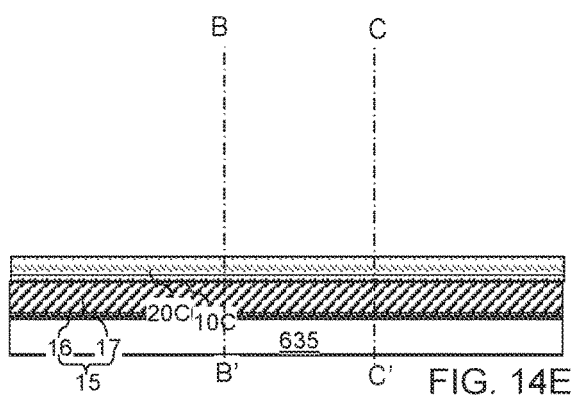
FIG. 14E is a vertical cross-sectional view of the second exemplary structure along the vertical plane E-E' of FIG. 14A.
Figure 15A:
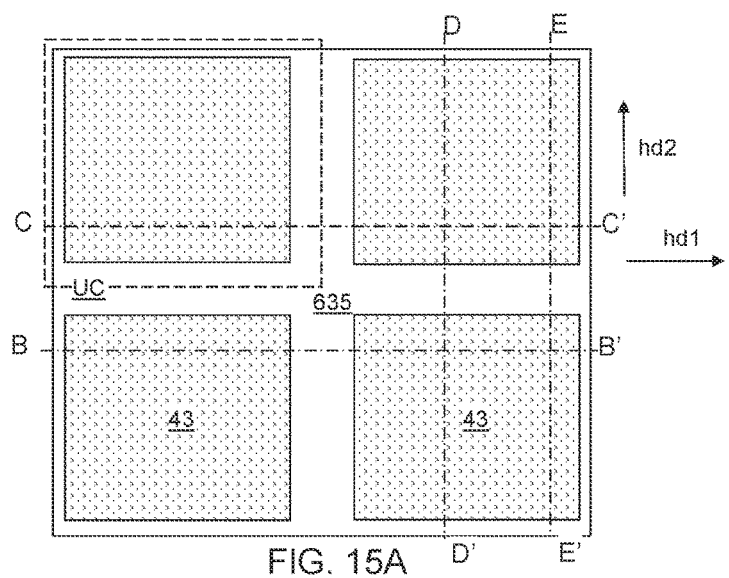
FIG. 15A is a top-down view of a portion of a memory array region of the second exemplary structure after patterning the lower continuous gate dielectric layer and the continuous semiconducting metal oxide layer into stacks of a bottom gate dielectric layer and a semiconducting metal oxide plate according to the second embodiment of the present disclosure.
Figure 15B:
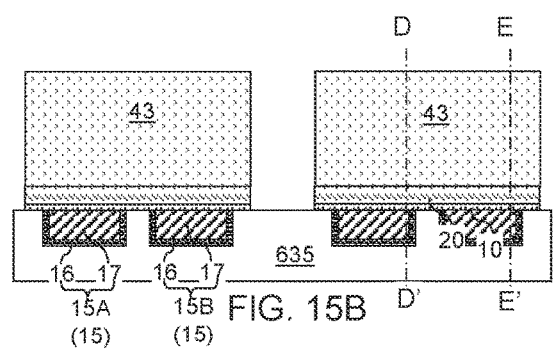
FIG. 15B is a vertical cross-sectional view of the second exemplary structure along the vertical plane B-B' of FIG. 15A.
Figure 15C:
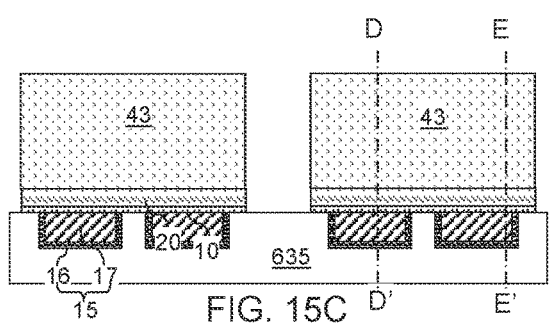
FIG. 15C is a vertical cross-sectional view of the second exemplary structure along the vertical plane C-C' of FIG. 15A.
Figure 16A:
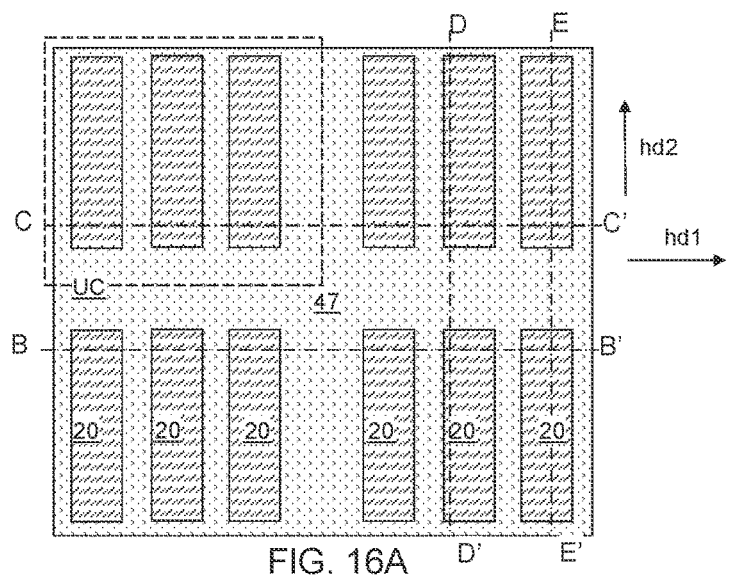
FIG. 16A is a top-down view of a portion of a memory array region of the second exemplary structure after formation of a TFT-level dielectric material layer, source cavities and drain cavities according to the second embodiment of the present disclosure.
Figure 16B:
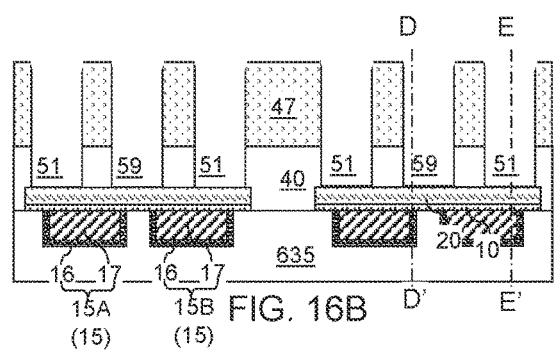
FIG. 16B is a vertical cross-sectional view of the second exemplary structure along the vertical plane B-B' of FIG. 16A.
Figure 16C:
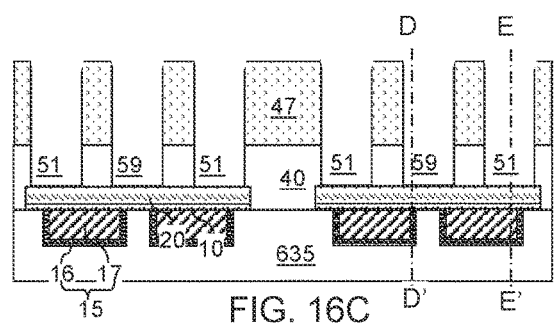
FIG. 16C is a vertical cross-sectional view of the second exemplary structure along the vertical plane C-C' of FIG. 16A.
Figure 16D:
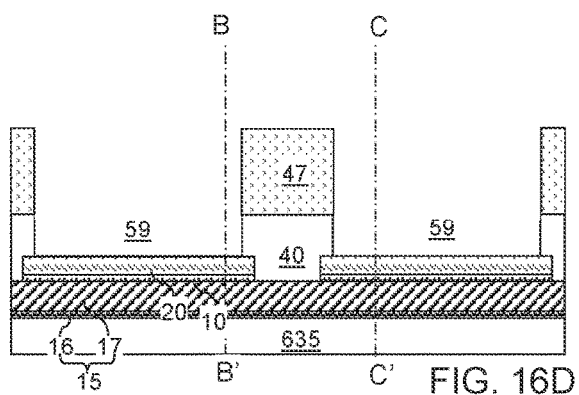
FIG. 16D is a vertical cross-sectional view of the second exemplary structure along the vertical plane D-D' of FIG. 16A.
Figure 16E:
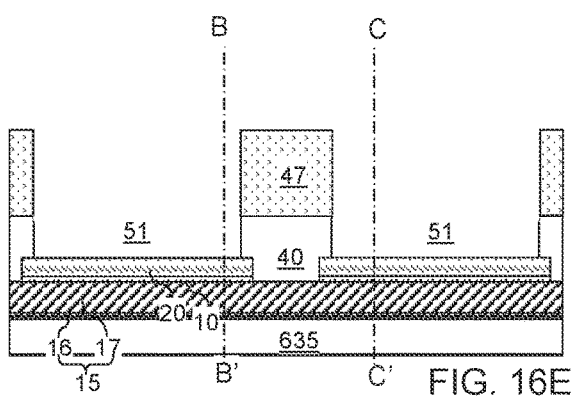
FIG. 16E is a vertical cross-sectional view of the second exemplary structure along the vertical plane E-E' of FIG. 16A.
Figure 17D:
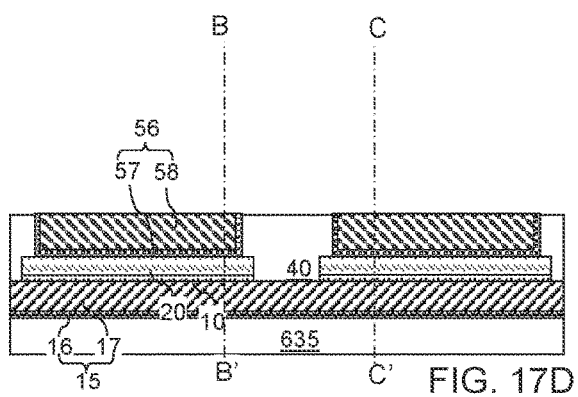
FIG. 17D is a vertical cross-sectional view of the second exemplary structure along the vertical plane D-D' of FIG. 17A.
Figure 17E:
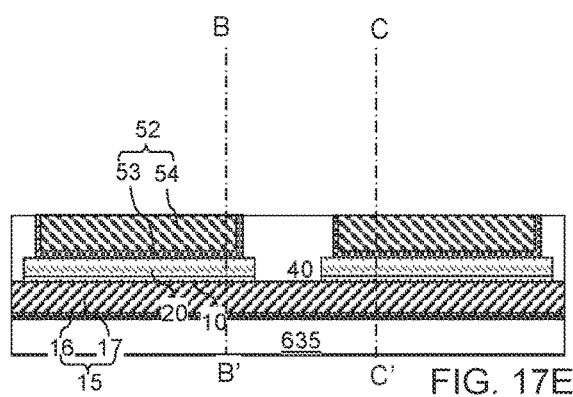
FIG. 17E is a vertical cross-sectional view of the second exemplary structure along the vertical plane E-E' of FIG. 17A.
Figure 18A:
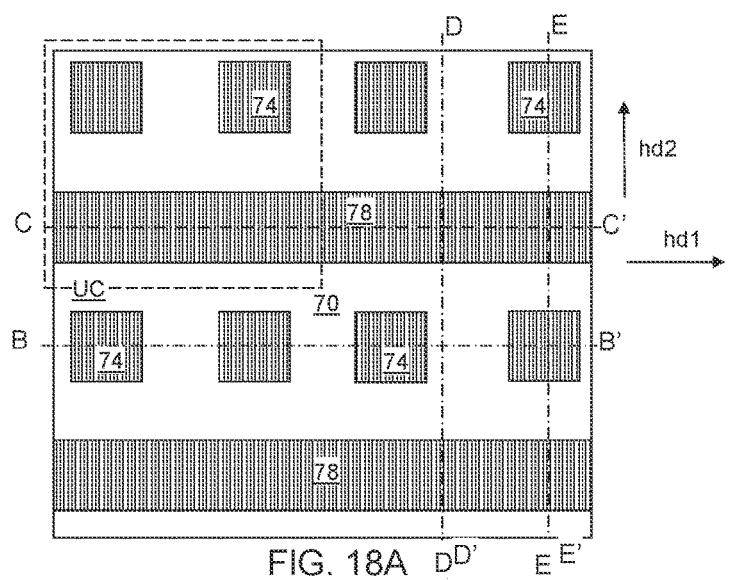
FIG. 18A is a top-down view of a portion of a memory array region of the second exemplary structure after formation of second upper-level dielectric material layers and second upper-level metal interconnect structures according to the second embodiment of the present disclosure.
Figure 18B:
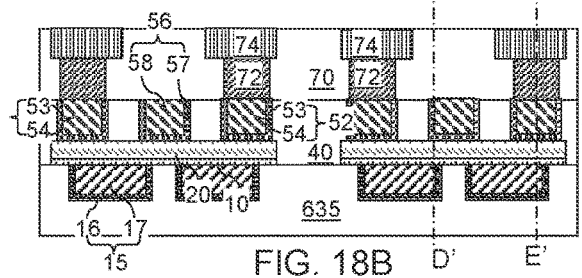
FIG. 18B is a vertical cross-sectional view of the second exemplary structure along the vertical plane B-B' of FIG. 18A.
Figure 18C:
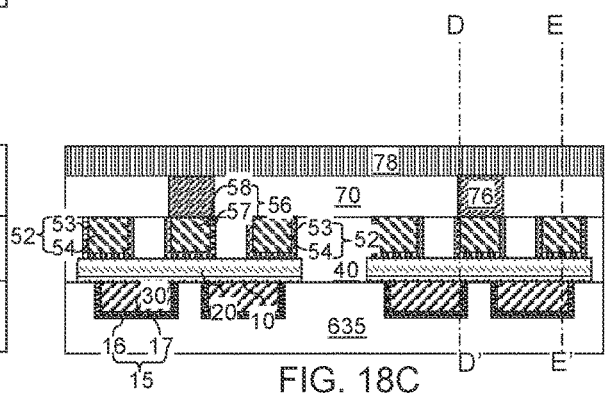
FIG. 18C is a vertical cross-sectional view of the second exemplary structure along the vertical plane C-C' of FIG. 18A.
Figure 19A:
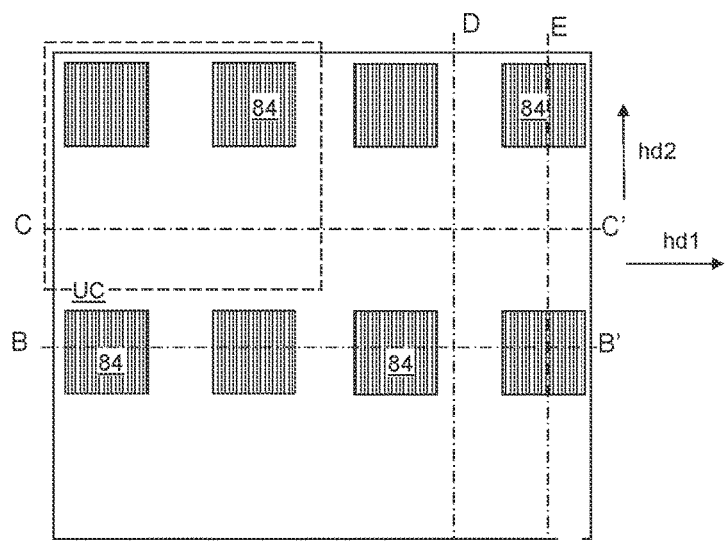
FIG. 19A is a top-down view of a portion of a memory array region of the second exemplary structure after formation of second upper-level dielectric material layers and second upper-level metal interconnect structures according to the second embodiment of the present disclosure.
Figure 19B:
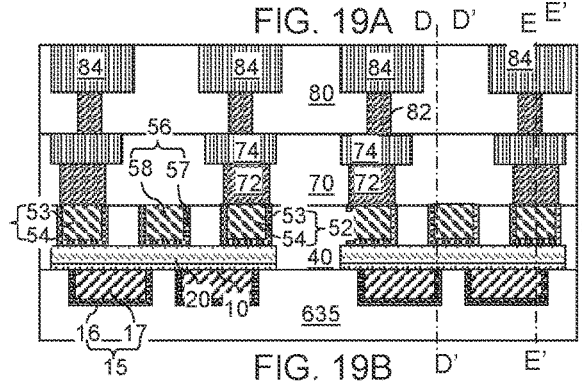
FIG. 19B is a vertical cross-sectional view of the second exemplary structure along the vertical plane B-B' of FIG. 19A.
Figure 19C:
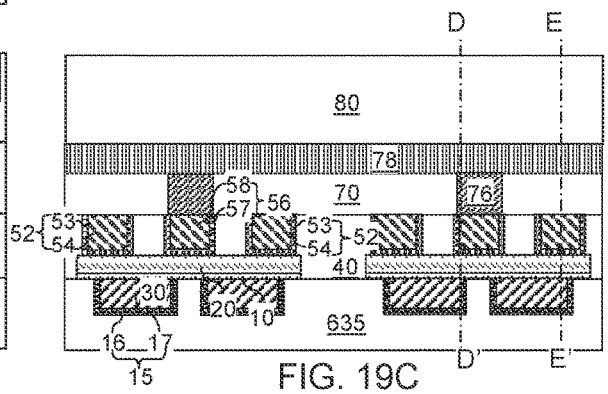
FIG. 19C is a vertical cross-sectional view of the second exemplary structure along the vertical plane C-C' of FIG. 19A.
Figure 20A:
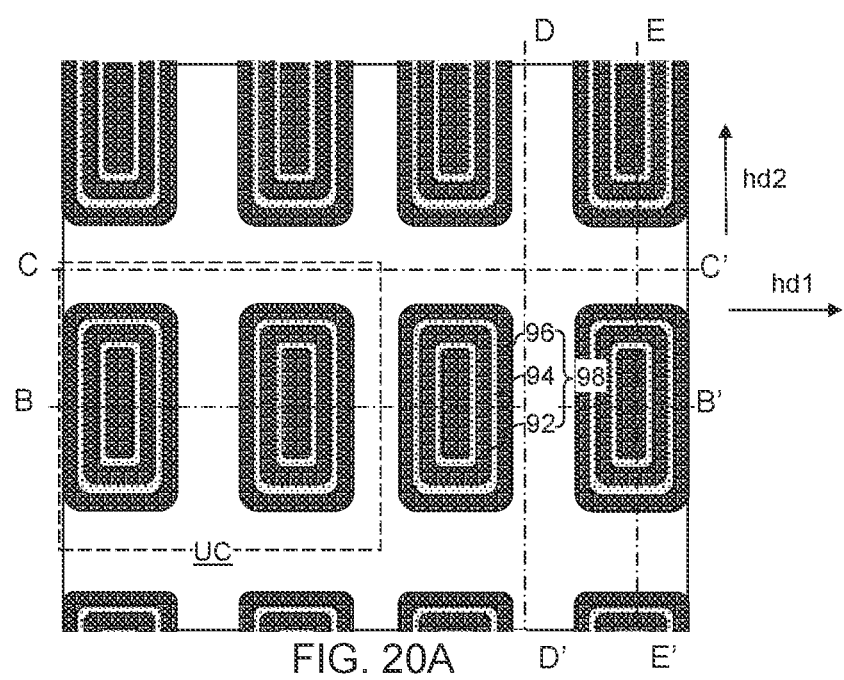
FIG. 20A is a top-down view of a portion of a memory array region of the second exemplary structure after formation of capacitor structures according to the second embodiment of the present disclosure.
Figure 21A:
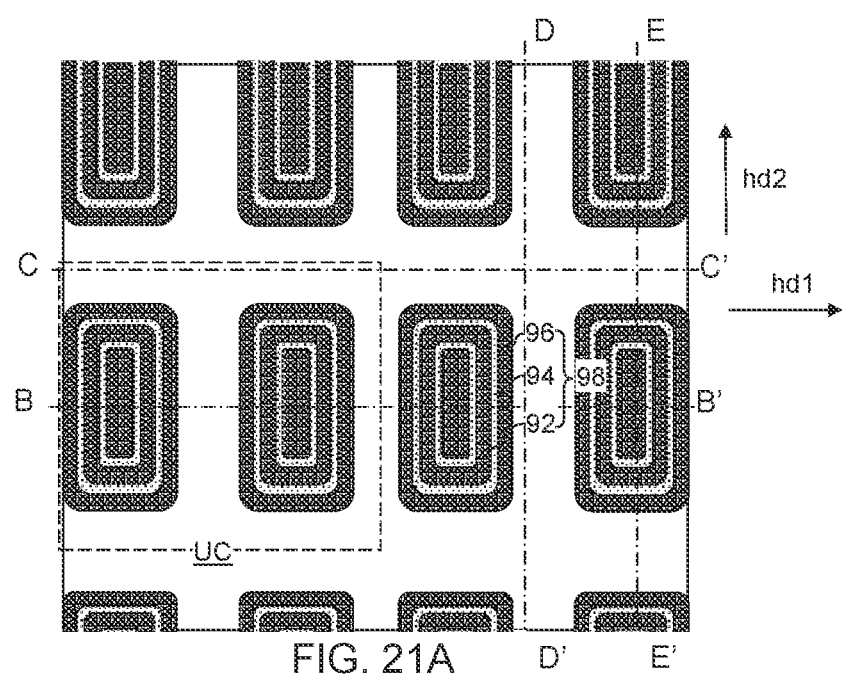
FIG. 21A is a top-down view of a portion of a memory array region of an alternative configuration of the second exemplary structure after formation of capacitor structures according to the second embodiment of the present disclosure. A capacitor-level dielectric material layer is not illustrated for clarity.
Figure 22A:
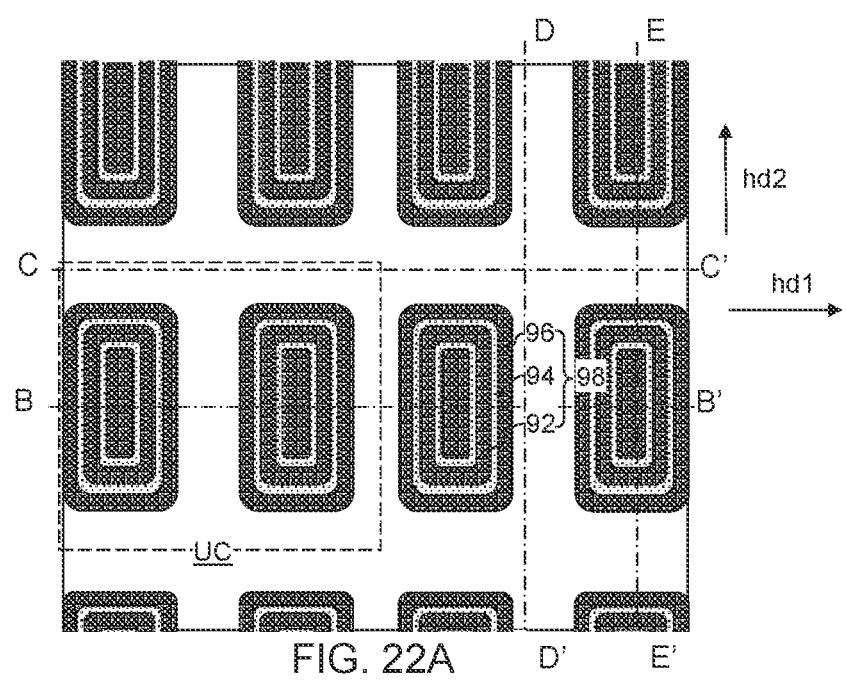
FIG. 22A is a top-down view of a portion of a memory array region of an alternative configuration of an exemplary structure after formation of capacitor structures according to an embodiment of the present disclosure. A capacitor-level dielectric material layer is not illustrated for clarity.

Referring to FIG. 13, the first exemplary structure is illustrated after formation of a two-dimensional array of memory cells 99 over the insulating matrix layer 635. Various additional metal interconnect structures (632, 668) may be formed in the insulating matrix layer 635, the TFT-level dielectric material layer 40, and the upper-level dielectric material layers (70, 80, 90). The additional metal interconnect structures (632, 668) may include, for example, second metal via structures 632 that may be formed through the insulating matrix layer 635 and the TFT-level dielectric material layer 40 on a top surface of a respective one of the second metal line structures 628. Further, the additional metal interconnect structures (632, 668) may include, for example, metal line structures that are formed in upper portions of the capacitor-level dielectric material layer 90, which are herein referred to as sixth metal line structures 668.

Additional interconnect-level dielectric material layer and additional metal interconnect structures may be subsequently formed. For example, a seventh interconnect-level dielectric material layer 670 embedding seventh metal line structures 678 and sixth metal via structures 672 may be formed above the capacitor-level dielectric material layer 90. While the present disclosure is described using an embodiment in which seven levels of metal line structures are used, embodiments are expressly contemplated herein in which a lesser or greater number of interconnect levels are used.

Referring to FIGS. 14A-14E, a second exemplary structure according to a second embodiment of the present disclosure may be derived from the first exemplary structure illustrated in FIGS. 4A-4E by omitting formation of the continuous top gate dielectric layer 30C.

Referring to FIGS. 15A-15E, the processing steps of FIGS. 5A-5E may be performed in the absence of the continuous top gate dielectric layer 30C to form a two-dimensional array of layer stacks of a bottom gate dielectric layer 10 and a semiconducting metal oxide plate 20.

Referring to FIGS. 16A-16E, the processing steps of FIGS. 7A-7E may be performed with a modification in the pattern in the photoresist layer 47. Specifically, the pattern in the photoresist layer 47 may be modified to remove the pattern of the top gate trenches 34. The pattern in the photoresist layer 47 may be transferred through the TFT-level dielectric material layer 40 to form source cavities 51 and drain cavities 59.

A pair of source cavities 51 may be formed over each semiconducting metal oxide plate 20. Specifically, the pair of source cavities 51 may be formed at end portions of a respective one of the semiconducting metal oxide plates 20 that are laterally spaced apart along the first horizontal direction hd1. The area of each source cavity 51 may be entirely within the area of an underlying semiconducting metal oxide plate 20. A portion of a top surface of a semiconducting metal oxide plate 20 may be physically exposed at the bottom of each source cavity 51.

A drain cavity 59 may be formed over each semiconducting metal oxide plate 20 between the areas of a pair of bottom word lines 15. A portion of a top surface of a semiconducting metal oxide plate 20 may be physically exposed at the bottom of each drain cavity 59.

Generally, a set of cavities (51, 59) may be formed through the TFT-level dielectric material layer 40 down to a top surface of each semiconducting metal oxide plate 20. The set of cavities (51, 59) may comprise, from one side to another along the first horizontal direction hd1, a first source cavity 51, a drain cavity 59, and a second source cavity 51. The photoresist layer 47 may be subsequently removed, for example, by ashing.

Each portion of a first bottom word line 15A having an areal overlap with an overlying semiconducting metal oxide plate 20 constitutes a first gate electrode, and each portion of a bottom gate dielectric 10 having an areal overlap with an underlying first gate electrode constitutes a first gate dielectric. Each contiguous combination of a first gate electrode and a first gate dielectric constitutes a first gate structure. Each portion of a second bottom word line 15B having an areal overlap with an overlying semiconducting metal oxide plate 20 constitutes a second gate electrode, and each portion of a bottom gate dielectric 10 having an areal overlap with an underlying second gate electrode constitutes a second gate dielectric. Each contiguous combination of a second gate electrode and a second gate dielectric constitutes a second gate structure. In this embodiment, a first gate structure and a second gate structure may be formed below each semiconducting metal oxide plate 20. The first gate structure and the second gate structure are laterally spaced apart along the first horizontal direction hd1. The first gate structure comprises a first gate dielectric and a first gate electrode, and the second gate structure comprises a second gate dielectric and a second gate electrode.

Referring to FIGS. 17A-17E, the processing steps of FIGS. 8A-8E may be performed to form source electrodes 52 and drain electrodes 56. In one embodiment, each source electrode 52 may include a source metallic liner 53 and a source metallic fill material portion 54. Each drain electrode 56 may include a drain metallic liner 57 and a drain metallic fill material portion 58.

Generally, a first source electrode 52, a drain electrode 56, and a second source electrode 52 may be formed on a respective portion of a top surface of each semiconducting metal oxide plate 20. The drain electrode 56 may be formed between a first gate structure (which may comprise a combination of a first bottom gate dielectric and a first bottom gate electrode), and a second gate structure (which may comprise a combination of a second bottom gate dielectric and a second bottom gate electrode). The first source electrode 52 is laterally spaced from the drain electrode 56 by the first gate structure (15A, 10), and the second source electrode 52 is laterally spaced from the drain electrode 56 by the second gate structure (15A, 10).

Generally, a first source electrode 52, a drain electrode 56, and a second source electrode 52 may be formed on a respective portion of a top surface of a semiconducting metal oxide plate 20 within each unit cell UC. The drain electrode 56 is formed between the first gate structure and the second gate structure. The first source electrode 52 is laterally spaced from the drain electrode 56 by the first gate structure, and the second source electrode 52 is laterally spaced from the drain electrode 56 by the second gate structure.

Referring to FIGS. 18A-18E, the processing steps of FIG. 9A-9E may be performed to form at least one first upper-level dielectric material layer 70 and first upper-level metal interconnect structures (72, 74, 76, 78) over the TFT-level dielectric material layer 40.

Referring to FIGS. 19A-19E, the processing steps of FIGS. 10A-10E may be performed to form at least one second upper-level dielectric material layer 80 and second upper-level metal interconnect structures (82, 84) over the at least one first upper-level dielectric material layer 70.

Generally, upper-level dielectric material layers (70, 80) may be formed over the TFT-level dielectric material layer 40. Source-connection metal interconnect structures (72, 74, 82, 84) may be formed within the upper-level dielectric material layers (70, 80), which may be used to electrically connect each of the source electrodes 52 to a conductive node of a respective capacitor structure to be subsequently formed. Within each unit cell UC, first source-connection metal interconnect structures (72, 74, 82, 84) may be used to provide electrical connection between a first source electrode 52 to a first conductive node of a first capacitor structure to be subsequently formed, and second source-connection metal interconnect structures (72, 74, 82, 84) may be used to provide electrical connection between a second source electrode 52 and a second conductive node of a second capacitor structure to be subsequently formed.

Referring to FIGS. 20A-20E, the processing steps of FIGS. 11A-11E may be performed to form capacitor structures 98 formed within a capacitor-level dielectric material layer 90. Optionally, a dielectric etch stop layer 89 may be formed on a top surface of the second upper-level dielectric material layer 80. Each contiguous combination of a first capacitor plate 92, a node dielectric 94, and a second capacitor plate 96 constitutes a capacitor structure 98. A pair of capacitor structures 98 may be formed within each unit cell UC. Thus, a first capacitor structure 98 and a second capacitor structure 98 may be formed within each unit cell UC. A first conductive node (such as a first capacitor plate 92) of the first capacitor structure 98 is electrically connected to an underlying first source electrode 52, and a second conductive node (such as another first capacitor plate 92) of the second capacitor structure 98 is electrically connected to an underlying second source electrode 52.

Generally, the field effect transistors 701 located on the substrate 8 may be electrically connected to the various nodes of the thin film transistors formed within the TFT-level dielectric material layer 40. A subset of the field effect transistors 701 is electrically connected to at least one of the drain electrodes 56, the first gate electrodes (comprising portions of bottom word lines 15 and/or as portions of top word lines 35), and the second gate electrodes (comprising portions of bottom word lines 15 and/or as portions of top word lines 35). A bottom surface of a first conductive node of a first capacitor structure 98 may contact a top surface of a respective one of the first source-connection metal interconnect structures (72, 74, 82, 84). A bottom surface of a second conductive node of a second capacitor structure 98 contacts a top surface of a respective one of the second source-connection metal interconnect structures (72, 74, 82, 84).

The capacitor-level dielectric material layer 90 may be formed over the capacitor structures 98. Each of the capacitor structures 98 may be formed within, and are laterally surrounded by, the capacitor-level dielectric material layer 90, which is one of the upper-level dielectric material layers (70, 80, 90). In one embodiment, each of the first capacitor plates 92 may be electrically connected to (i.e., electrically shorted to) a respective one of the source electrodes 52. Each of the second capacitor plates 96 may be electrically grounded, for example, by forming an array of conductive via structures (not shown) that contact the second capacitor plates 96 and connected to an overlying metallic plate (not shown).

Referring to FIGS. 21A-21E, a memory array region of an alternative configuration of the second exemplary structure is illustrated after formation of capacitor structures according to the second embodiment of the present disclosure. The alternative configuration of the second exemplary structure may be derived from the second exemplary structure illustrated in FIGS. 20A-20E by modifying the patterning process illustrated in FIGS. 15A-15E. Specifically, a set of multiple semiconducting metal oxide plates 20 that are laterally spaced apart along the second horizontal direction hd2 may be formed in each unit cell UC in lieu of a single semiconducting metal oxide plate 20. Each semiconducting metal oxide plate 20 within a set of multiple semiconducting metal oxide plates 20 may have a respective horizontal cross-sectional shape of a rectangle or a rounded rectangle.

Thus, each source electrode 52 may contact end portions of top surfaces of the set of semiconducting metal oxide plates 20, and each drain electrode 56 may contact middle portions of top surfaces of the set of semiconducting metal oxide plates 20. Each gate electrode (which may comprise a portion of a bottom word line 15 or as a portion of a top word line 35) may straddle each semiconducting metal oxide plate 20 within the set of semiconducting metal oxide plates 20.

Referring to FIGS. 22A-22E, a memory array region of an alternative configuration of an exemplary structure is illustrated after formation of capacitor structures according to an embodiment of the present disclosure. The alternative configuration of the exemplary structure may be derived from any of the exemplary structures described above by forming air gaps (87, 97) in dielectric material layers. For example, second upper-level metal interconnect structures (82, 84) may be formed over the at least one first upper-level dielectric material layer 70, and the at least one second upper-level dielectric material layer 80 may be subsequently deposited using at least one anisotropic dielectric material deposition process to form second upper-level air gaps 87 embedded within the second upper-level dielectric material layer 80. Further, the capacitor-level dielectric material layer 90 may be formed by anisotropic deposition of a dielectric material. In this embodiment, capacitor-level air gaps 97 may be formed within the capacitor-level dielectric material layer 90 between neighboring pairs of capacitor structures 98. Additional air gaps (not illustrated) may be formed in additional metal interconnect levels such as the level of the at least one first upper-level dielectric material layer 70, any overlying metal interconnect level, and/or any underlying metal interconnect level.

Figure 23:
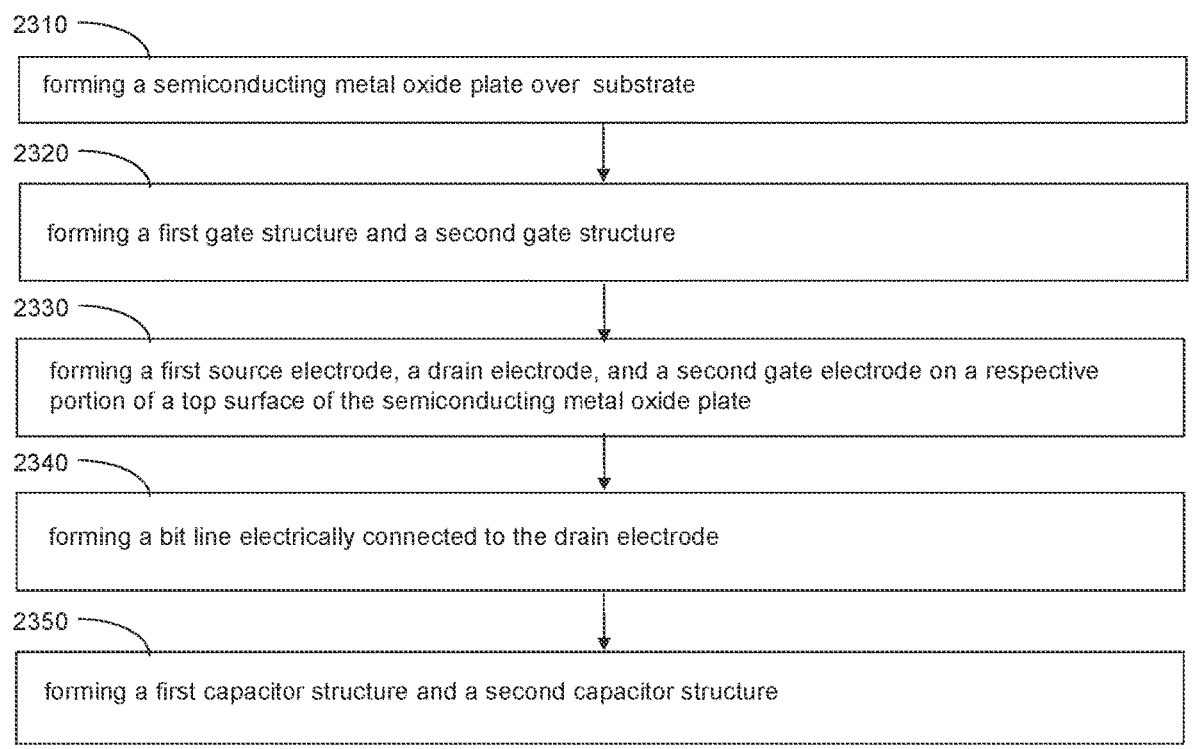
FIG. 23 is a flowchart that illustrates the general processing steps for manufacturing the semiconductor device of the present disclosure.

FIG. 23 is a flowchart that illustrates the general processing steps for manufacturing the semiconductor device of the present disclosure. Referring to step 2310 and FIGS. 1-5E, 12A-12E, and 14A-15E, a semiconducting metal oxide plate 20 may be formed over a substrate 8.

Referring to step 2320 and FIGS. 2A-3E, 7A-8E, 12A-12E, and 16A-17E, a first gate structure {(15A, 10) or (30A, 35)} and a second gate structure {(15B, 10) or (30B, 35)} may be formed below or above the semiconducting metal oxide plate 20. The first gate structure {(15A, 10) or (30A, 35)} and the second gate structure {(15B, 10) or (30B, 35)} are laterally spaced apart along a first horizontal direction hd1. The first gate structure {(15A, 10) or (30A, 35)} comprises a first gate dielectric and a first gate electrode, and the second gate structure {(15B, 10) or (30B, 35)} comprises a second gate dielectric and a second gate electrode.

Referring to step 2330 and FIGS. 7A-8E, 12A-12E, and 16A-17E, a first source electrode 52, a drain electrode 56, and a second source electrode 52 may be formed on a respective portion of a top surface of the semiconducting metal oxide plate 20. The drain electrode 56 is formed between the first gate structure {(15A, 10) or (30A, 35)} and the second gate structure {(15B, 10) or (30B, 35)}. The first source electrode 52 is laterally spaced from the drain electrode 56 by the first gate structure {(15A, 10) or (30A, 35)}, and the second source electrode 52 is laterally spaced from the drain electrode 56 by the second gate structure {(15B, 10) or (30B, 35)}.

Referring to step 2340, a bit line 78 laterally extending along the first horizontal direction hd1 and electrically connected to the drain electrode 56 may be formed.

Referring step 2350, a first capacitor structure 98 and a second capacitor structure 98 may be formed. A first conductive node (such as a first capacitor plate 92) of the first capacitor structure 98 is electrically connected to the first source electrode 52, and a second conductive node (such as another first capacitor plate 92) of the second capacitor structure 98 is electrically connected to the second source electrode 52.

Referring to all drawings and according to various embodiments of the present disclosure, a semiconductor device is provided, which comprises: a first thin film transistor and a second thin film transistor comprising a semiconducting metal oxide plate 20 located over a substrate 8 as a continuous material portion, and a set of electrode structures (52, 15, 35, 56) located on the semiconducting metal oxide plate 20 and comprising, from one side to another along a first horizontal direction hd1, a first source electrode 52, a first gate electrode (15, 35), a drain electrode 56, a second gate electrode (15, 35), and a second source electrode 52, wherein the first gate electrode (15, 35) and the second gate electrode (15, 35) are spaced from the semiconducting metal oxide plate 20 by a first gate dielectric (10 or 30A) and a second gate dielectric (10 or 30B), respectively, wherein a first portion of the semiconducting metal oxide plate 20 laterally extending between the first source electrode 52 and the drain electrode 56 comprises a first semiconductor channel, and wherein a second portion of the semiconducting metal oxide plate 20 laterally extending between the second source electrode 52 and the drain electrode 56 comprises a second semiconductor channel; a bit line 78 overlying the semiconducting metal oxide plate 20, electrically connected to the drain electrode 56, and laterally extending along the first horizontal direction hd1; a first capacitor structure 98 comprising a first conductive node (such as a first capacitor plate 92) that is electrically connected to the first source electrode 52; and a second capacitor structure 98 comprising a second conductive node (such as another first capacitor plate 92) that is electrically connected to the second source electrode 52.

In one embodiment, the substrate 8 comprises a single crystalline silicon substrate; lower-level dielectric material layers (601, 610, 620) embedding lower-level metal interconnect structures (612, 618, 622, 628) are located between the single crystalline silicon substrate and the semiconducting metal oxide plate 20; and the semiconductor device comprises field effect transistors 701 including a respective portion of the single crystalline silicon substrate as a channel and electrically connected to at least one of the drain electrode 56, the first gate electrode (15, 35), and the second gate electrode (15, 35).

In one embodiment, the first gate electrode comprises a portion of a first word line (15 or 35) having an areal overlap with the semiconducting metal oxide plate 20 in a plan view (i.e., a view along the vertical direction); the second gate electrode comprises a portion of a second word line (15 or 35) having an areal overlap with the semiconducting metal oxide plate 20 in the plan view; and the first word line (15 or 35) and the second word line (15 or 35) laterally extend along a second horizontal direction hd2 that is perpendicular to the first horizontal direction hd1.

In one embodiment, the field effect transistors 701 comprise: a first word line driver configured to apply a first gate voltage to the first word line (15 or 35) through a first subset of the lower-level metal interconnect structures (612, 618, 622, 628); and a second word line driver configured to apply a second gate voltage to the second word line (15 or 35) through a second subset of the lower-level metal interconnect structures (612, 618, 622, 628).

In one embodiment, the field effect transistors 701 comprise: a bit line driver configured to apply a bit line bias voltage to the bit line 78; and a sense amplifier configured to detect electrical current that flows through the bit line 78 during a read operation.

In one embodiment, the semiconducting metal oxide plate 20 and the set of electrode structures (52, 15, 35, 56) are formed within a TFT-level dielectric material layer 40; and top surfaces of the first source electrode 52, the drain electrode 56, and the second source electrode 52 are located within a horizontal plane including a top surface of the TFT-level dielectric material layer 40.

In one embodiment, the semiconductor device comprises: upper-level dielectric material layers (70, 80, 90) located over the TFT-level dielectric material layer 40; first source-connection metal interconnect structures (72, 74, 82, 84) formed within in the upper-level dielectric material layers (70, 80, 90) and electrically connecting the first source electrode 52 to the first conductive node (such as a first capacitor plate 92) of the first capacitor structure 98; and second source-connection metal interconnect structures (72, 74, 82, 84) formed within the upper-level dielectric material layers (70, 80, 90) and electrically connecting the second source electrode 52 to the second conductive node (such as another first capacitor plate 92) of the second capacitor structure 98.

In one embodiment, a bottom surface of the first conductive node contacts a top surface of the first source-connection metal interconnect structures (72, 74, 82, 84) (such as a second source connection pad 84); a bottom surface of the second conductive node contacts a top surface of the second source-connection metal interconnect structures (72, 74, 82, 84) (such as another second source connection pad 84); and the first capacitor structure 98 and the second capacitor structure 98 are formed within, and are laterally surrounded by, one of the upper-level dielectric material layers (70, 80, 90) (such as a capacitor-level dielectric material layer 90).

In one embodiment, the first gate dielectric (comprising a portion of a bottom gate dielectric layer 10) contacts a first portion of a bottom surface of the semiconducting metal oxide plate 20; the first gate electrode (comprising a portion of a bottom word line 15) contacts a bottom surface of the first gate dielectric; the second gate dielectric (comprising another portion of a bottom gate dielectric layer 10) contacts a second portion of the bottom surface of the semiconducting metal oxide plate 20; and the second gate electrode (comprising portion of another bottom word line 15) contacts a bottom surface of the second gate dielectric.

In one embodiment, the semiconductor device comprises: an additional first gate dielectric (such as a first top gate dielectric 30A) contacting a first portion of a top surface of the semiconducting metal oxide plate 20; an additional first gate electrode (such as a portion of a top word line 35) contacting a top surface of the additional first gate dielectric; an additional second gate dielectric (such as a second top gate dielectric 30B) contacting a second portion of the top surface of the semiconducting metal oxide plate 20; and an additional second gate electrode (such as a portion of another top word line 35) contacting a top surface of the additional second gate dielectric.

In one embodiment, each of the first source electrode 52, the first additional gate electrode 35, the drain electrode 56, the second additional gate electrode 35, and the second source electrode 52 has a respective top surface located within a horizontal plane including a top surface of a TFT-level dielectric material layer 40 that has formed therein the semiconducting metal oxide plate 20; and each of the first source electrode 52, the first additional gate electrode 35, the drain electrode 56, the second additional gate electrode 35, and the second source electrode 52 comprises a combination of a respective metallic barrier liner (53, 36, 57) having a first material composition and a respective metallic fill material portion (54, 37, 58) having a second material composition.

According to an aspect of the present disclosure, a semiconductor device is provided, which comprises: a two-dimensional array of access transistor pairs located over a substrate 8, wherein each of the access transistor pairs comprises a first thin film transistor and a second thin film transistor comprising a semiconducting metal oxide plate 20, and a set of electrode structures (52, 15, 35, 56) located on the semiconducting metal oxide plate 20 and comprising, from one side to another along a first horizontal direction hd1, a first source electrode 52, a first gate electrode (comprising a portion of a first word line (15 or 35)), a drain electrode 56, a second gate electrode (comprising a portion of a second word line (15 or 35)), and a second source electrode 52, wherein the first gate electrode (15 or 35) and the second gate electrode (15 or 35) are spaced from the semiconducting metal oxide plate 20 by a first gate dielectric (10 or 30A) and a second gate dielectric (10 or 30B), respectively, wherein a first portion of the semiconducting metal oxide plate 20 laterally extending between the first source electrode 52 and the drain electrode 56 comprises a first semiconductor channel, and wherein a second portion of the semiconducting metal oxide plate 20 laterally extending between the second source electrode 52 and the drain electrode 56 comprises a second semiconductor channel; bit lines 78 laterally extending along the first horizontal direction hd1 and electrically connected to a respective column of the drain electrode 56; first word lines (15 or 35) laterally extending along a second horizontal direction hd2 and including a respective row of the first gate electrodes as material portions therein; second word lines (15 or 35) laterally extending along the second horizontal hd2 and including a respective row of the second source electrodes as material portions therein; and a two-dimensional array of capacitor pairs, wherein each of the capacitor pairs comprises a first capacitor structure 98 comprising a first conductive node (such as a first capacitor plate 92) that is electrically connected to (i.e., electrically shorted to) a respective one of the first source electrodes 52 and a second capacitor structure 98 comprising a second conductive node (such as another first capacitor plate 92) that is electrically connected to a respective one of the second source electrodes 52.

In one embodiment, the substrate 8 comprises a single crystalline silicon substrate; lower-level dielectric material layers (601, 610, 620) having formed therein lower-level metal interconnect structures (612, 618, 622, 628) are located between the single crystalline silicon substrate and the semiconducting metal oxide plate 20; and the semiconductor device comprises field effect transistors 701 including a respective portion of the single crystalline silicon substrate as a channel and electrically connected to at least one of the drain electrode 56, the first gate electrode, and the second gate electrode.

In one embodiment, the field effect transistors 701 comprise: first word line drivers configured to apply a first gate voltage to a respective one of the first word lines (15 or 35) through a respective subset of the lower-level metal interconnect structures (612, 618, 622, 628); second word line drivers configured to apply a second gate voltage to a respective one of the second word lines (15 or 35) through a respective subset of the lower-level metal interconnect structures (612, 618, 622, 628); bit line drivers configured to apply a bit line bias voltage to a respective one of the bit lines 78; and a sense amplifier circuit configured to detect electrical current that flows through the bit lines 78 during a read operation.

The various embodiments of the present disclosure uses thin film transistors as access transistors for a capacitor structure in a dynamic random access memory cell. Further, a pair of thin film transistors are merged such that a common portion of a semiconducting metal oxide plate 20 is used to provide electrical contact to a common drain node, which may comprise a drain electrode 56 contacting a center portion of the semiconducting metal oxide plate 20. Further, use of field effect transistors 701 using portions of a single crystalline silicon layer as channel regions provides vertical stacking of a peripheral circuit, access transistors, and capacitor structures. Thus, a high density array of random access memory cells may be provided using the various embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first thin film transistor and a second thin film transistor comprising a semiconducting metal oxide plate located over a substrate as a continuous material portion, and a set of electrode structures located on the semiconducting metal oxide plate and comprising, from one side to another along a first horizontal direction, a first source electrode, a first gate electrode, a drain electrode, a second gate electrode, and a second source electrode, wherein the first gate electrode and the second gate electrode are spaced from the semiconducting metal oxide plate by a first gate dielectric and a second gate dielectric, respectively, wherein a first portion of the semiconducting metal oxide plate laterally extending between the first source electrode and the drain electrode comprises a first semiconductor channel, and wherein a second portion of the semiconducting metal oxide plate laterally extending between the second source electrode and the drain electrode comprises a second semiconductor channel;
a bit line overlying the semiconducting metal oxide plate, electrically connected to the drain electrode, and laterally extending along the first horizontal direction;
a first capacitor structure comprising a first conductive node that is electrically connected to the first source electrode; and
a second capacitor structure comprising a second conductive node that is electrically connected to the second source electrode,
wherein:
the semiconducting metal oxide plate and each of the first source electrode, the first gate electrode, the drain electrode, the second gate electrode, and the second source electrode are located within a TFT-level dielectric material layer;
each of the first source electrode, the first gate electrode, the drain electrode, the second gate electrode, and the second source electrode comprises a respective horizontal top surface that is located within a horizontal plane including a top surface of the TFT-level dielectric material layer;
each of the first source electrode, the first gate electrode, the drain electrode, the second gate electrode, and the second source electrode comprises a respective horizontal bottom surface, the respective horizontal top surface, and straight sidewalls that vertically extend from a periphery of the respective bottom to surface to a periphery of the respective top surface; and
all of the straight sidewalls of the first source electrode, the first gate electrode, the drain electrode, the second gate electrode, and the second source electrode are in direct contact with the TFT-level dielectric material layer.

2. The semiconductor device of claim 1, wherein:
the first gate electrode comprises a portion of a first word line having an areal overlap with the semiconducting metal oxide plate in a plan view;
the second gate electrode comprises a portion of a second word line having an areal overlap with the semiconducting metal oxide plate in the plan view; and
the first word line and the second word line laterally extend along a second horizontal direction that is perpendicular to the first horizontal direction.

3. The semiconductor device of claim 1, further comprising:
upper-level dielectric material layers located over the TFT-level dielectric material layer;
first source-connection metal interconnect structures formed within the upper-level dielectric material layers and electrically connecting the first source electrode to the first conductive node of the first capacitor structure; and
second source-connection metal interconnect structures formed within in the upper-level dielectric material layers and electrically connecting the second source electrode to the second conductive node of the second capacitor structure.

4. The semiconductor device of claim 1, wherein:
the first gate dielectric contacts a first portion of a bottom surface of the semiconducting metal oxide plate;
the first gate electrode contacts a bottom surface of the first gate dielectric;
the second gate dielectric contacts a second portion of the bottom surface of the semiconducting metal oxide plate; and
the second gate electrode contacts a bottom surface of the second gate dielectric.

5. The semiconductor device of claim 4, further comprising:
an additional first gate dielectric contacting a first portion of a top surface of the semiconducting metal oxide plate;
an additional first gate electrode contacting a top surface of the additional first gate dielectric;
an additional second gate dielectric contacting a second portion of the top surface of the semiconducting metal oxide plate; and
an additional second gate electrode contacting a top surface of the additional second gate dielectric.

6. The semiconductor device of claim 5, wherein:
each of the first source electrode, the first additional gate electrode, the drain electrode, the second additional gate electrode, and the second source electrode has a respective horizontal top surface located within a horizontal plane including the top surface of the TFT-level dielectric material layer; and
each of the first source electrode, the first additional gate electrode, the drain electrode, the second additional gate electrode, and the second source electrode comprises a combination of a respective metallic barrier liner having a first material composition and a respective metallic fill material portion having a second material composition.

7. The semiconductor device of claim 1, wherein:
each of the first source electrode, the first gate electrode, the drain electrode, the second gate electrode, and the second source electrode consists of a same set of at least one conductive material so that each conductive material that is present within one of the first source electrode, the first gate electrode, the drain electrode, the second gate electrode, and the second source electrode is also present in any other of the first source electrode, the first gate electrode, the drain electrode, the second gate electrode, and the second source electrode;
the at least one conductive material comprises a metallic liner material and a metallic fill material; and
each portion of the metallic liner material located within a respective one of the first source electrode, the first gate electrode, the drain electrode, the second gate electrode, and the second source electrode is in direct contact with the semiconducting metal oxide plate, a top surface of the first gate dielectric, or a top surface of the second gate dielectric, and comprises a respective periphery located within the horizontal plane including the top surface of the TFT-level dielectric material layer.

8. The semiconductor device of claim 1, wherein:
each of the first gate dielectric and a second gate dielectric is a planar structure having a respective horizontal top surface contained entirely within an additional horizontal plane that underlies the horizontal plane including the top surface of the TFT-level dielectric material layer, and having a respective horizontal bottom surface contained entirely within another additional horizontal plane that underlies the additional horizontal plane and containing a top surface of the semiconducting metal oxide plate; and
bottom edges of straight sidewalls of the first gate electrode contact the horizontal top surface of the first gate dielectric and are laterally offset from sidewalls of the first gate dielectric; and
bottom edges of straight sidewalls of the second gate electrode contact the horizontal top surface of the second gate dielectric and are laterally offset from sidewalls of the second gate dielectric.

9. The semiconductor device of claim 1, wherein top surfaces of the first source electrode, the first gate electrode, the drain electrode, the second gate electrode, and the second source electrode are located entirely within, and do not extend above, a same horizonal plane.

10. A semiconductor device comprising:
a two-dimensional array of access transistor pairs located over a substrate, wherein each of the access transistor pairs comprises a first thin film transistor and a second thin film transistor comprising a semiconducting metal oxide plate, and a set of electrode structures located on the semiconducting metal oxide plate and comprising, from one side to another along a first horizontal direction, a first source electrode, a first gate electrode, a drain electrode, a second gate electrode, and a second source electrode, wherein the first gate electrode and the second gate electrode are spaced from the semiconducting metal oxide plate by a first gate dielectric and a second gate dielectric, respectively, wherein a first portion of the semiconducting metal oxide plate laterally extending between the first source electrode and the drain electrode comprises a first semiconductor channel, and wherein a second portion of the semiconducting metal oxide plate laterally extending between the second source electrode and the drain electrode comprises a second semiconductor channel;
bit lines laterally extending along the first horizontal direction and electrically connected to a respective column of the drain electrode;
first word lines laterally extending along a second horizontal direction and including a respective row of the first gate electrodes as material portions therein;
second word lines laterally extending along the second horizontal and including a respective row of the second gate electrodes as material portions therein; and
a two-dimensional array of capacitor pairs, wherein each of the capacitor pairs comprises a first capacitor structure comprising a first conductive node that is electrically coupled to a respective one of the first source electrodes and a second capacitor structure comprising a second conductive node that is electrically connected to a respective one of the second source electrodes, wherein:
the semiconducting metal oxide plate and each of the first source electrode, the first gate electrode, the drain electrode, the second gate electrode, and the second source electrode are located within a TFT-level dielectric material layer;
each of the first source electrode, the first gate electrode, the drain electrode, the second gate electrode, and the second source electrode comprises a respective horizontal top surface that is located within a horizontal plane including a top surface of the TFT-level dielectric material layer; each of the first source electrode, the first gate electrode, the drain electrode, the second gate electrode, and the second source electrode comprises a respective horizontal bottom surface, the respective horizontal top surface, and straight sidewalls that vertically extend from a periphery of the respective bottom to surface to a periphery of the respective top surface; and all of the straight sidewalls of the first source electrode, the first gate electrode, the drain electrode, the second gate electrode, and the second source electrode are in direct contact with the TFT-level dielectric material layer.

11. The semiconductor device of claim 10, wherein:

each of the first source electrode, the first gate electrode, the drain electrode, the second gate electrode, and the second source electrode consists of a same set of at least one conductive material so that each conductive material that is present within one of the first source electrode, the first gate electrode, the drain electrode, the second gate electrode, and the second source electrode is also present in any other of the first source electrode, the first gate electrode, the drain electrode, the second gate electrode, and the second source electrode;

the at least one conductive material comprises a metallic liner material and a metallic fill material; and each portion of the metallic liner material located within a respective one of the first source electrode, the first gate electrode, the drain electrode, the second gate electrode, and the second source electrode is in direct contact with the semiconducting metal oxide plate, a top surface of the first gate dielectric, or a top surface of the second gate dielectric, and comprises a respective periphery located within the horizontal plane including the top surface of the TFT-level dielectric material layer.

12. The semiconductor device of claim 10, wherein top surfaces of the first source electrode, the first gate electrode, the drain electrode, the second gate electrode, and the second source electrode are located entirely within, and do not extend above, a same horizontal plane.

13. A semiconductor device comprising:

a first thin film transistor and a second thin film transistor comprising a semiconducting metal oxide plate located over a substrate as a continuous material portion, and a set of electrode structures located on the semiconducting metal oxide plate and comprising, from one side to another along a first horizontal direction, a first source electrode, a first gate electrode, a drain electrode, a second gate electrode, and a second source electrode, wherein the first gate electrode and the second gate electrode are spaced from the semiconducting metal oxide plate by a first gate dielectric and a second gate dielectric, respectively, wherein a first portion of the semiconducting metal oxide plate laterally extending between the first source electrode and the drain electrode comprises a first semiconductor channel, and wherein a second portion of the semiconducting metal oxide plate laterally extending between the second source electrode and the drain electrode comprises a second semiconductor channel;

a bit line overlying the semiconducting metal oxide plate, electrically connected to the drain electrode, and laterally extending along the first horizontal direction;

a first capacitor structure comprising a first conductive node that is electrically connected to the first source electrode; and a second capacitor structure comprising a second conductive node that is electrically connected to the second source electrode, wherein:

the semiconducting metal oxide plate and each of the first source electrode, the first gate electrode, the drain electrode, the second gate electrode, and the second source electrode are located within a TFT-level dielectric material layer;

each of the first source electrode, the first gate electrode, the drain electrode, the second gate electrode, and the second source electrode comprises a respective horizontal top surface that is located within a horizontal plane including a top surface of the TFT-level dielectric material layer;

each of the first source electrode, the first gate electrode, the drain electrode, the second gate electrode, and the second source electrode comprises a respective horizontal bottom surface, the respective horizontal top surface, and straight sidewalls that vertically extend from a periphery of the respective bottom to surface to a periphery of the respective top surface; and all of the straight sidewalls of the first source electrode, the first gate electrode, the drain electrode, the second gate electrode, and the second source electrode are in direct contact with the TFT-level dielectric material layer.

14. The semiconductor device of claim 13, wherein:

each of the first source electrode, the first gate electrode, the drain electrode, the second gate electrode, and the second source electrode consists of a same set of at least one conductive material so that each conductive material that is present within one of the first source electrode, the first gate electrode, the drain electrode, the second gate electrode, and the second source electrode is also present in any other of the first source electrode, the first gate electrode, the drain electrode, the second gate electrode, and the second source electrode;

the at least one conductive material comprises a metallic liner material and a metallic fill material; and each portion of the metallic liner material located within a respective one of the first source electrode, the first gate electrode, the drain electrode, the second gate electrode, and the second source electrode is in direct contact with the semiconducting metal oxide plate, a top 11 surface of the first gate dielectric, or a top surface of the second gate dielectric, and comprises a respective periphery located within the horizontal plane including the top surface of the TFT-level dielectric material layer.

15. The semiconductor device of claim 13, wherein top surfaces of the first source electrode, the first gate electrode, the drain electrode, the second gate electrode, and the second source electrode are located entirely within, and do not extend above, a same horizontal plane.

\* \* \* \* \*